(12) United States Patent
Lee et al.

(10) Patent No.: US 11,668,993 B2
(45) Date of Patent: Jun. 6, 2023

(54) DISPLAY APPARATUS

(71) Applicant: LG Display Co., Ltd., Seoul (KR)

(72) Inventors: Sanghyun Lee, Paju-si (KR); Minsoo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/735,805

(22) Filed: May 3, 2022

(65) Prior Publication Data

US 2022/0260886 A1 Aug. 18, 2022

Related U.S. Application Data

(62) Division of application No. 16/523,666, filed on Jul. 26, 2019, now abandoned.

(30) Foreign Application Priority Data

Jul. 27, 2018 (KR) .......... 10-2018-0088103
Dec. 28, 2018 (KR) .......... 10-2018-0172871

(51) Int. Cl.
*G02F 1/167* (2019.01)
*G02F 1/1676* (2019.01)
*G02F 1/1679* (2019.01)
*G02F 1/1677* (2019.01)
*G02F 1/1335* (2006.01)
(Continued)

(52) U.S. Cl.
CPC .......... *G02F 1/167* (2013.01); *G02F 1/1368* (2013.01); *G02F 1/13452* (2013.01); *G02F 1/133512* (2013.01); *G02F 1/1676* (2019.01); *G02F 1/1677* (2019.01); *G02F 1/1679* (2019.01); *H01L 27/3225* (2013.01); *H01L 27/3272* (2013.01); *H01L 27/3276* (2013.01); *H01L 51/5284* (2013.01); *G02F 2201/44* (2013.01)

(58) Field of Classification Search
CPC .......... G02F 1/133512; G02F 1/1323; G09G 2320/068; G09G 2320/028; G09G 2358/00
See application file for complete search history.

(56) References Cited

U.S. PATENT DOCUMENTS 7,542,109 B2 6/2009 Jang et al.
2007/0054436 A1 3/2007 Hirakata et al.
(Continued)

FOREIGN PATENT DOCUMENTS

CN 101097343 A 1/2008
CN 101815965 A 8/2010
(Continued)

*Primary Examiner* — Alexander P Gross
(74) *Attorney, Agent, or Firm* — Birch, Stewart, Kolasch & Birch, LLP

(57) ABSTRACT

A display apparatus can include a display panel; a first light path control layer including a plurality of lower slits, a first electrophoresis liquid having first light blocking particles injected into the plurality of lower slits, and a lower driving electrode pattern disposed to intersect a longitudinal direction of the plurality of lower slits; and a second light path control layer disposed on the first light path control layer, the second light path control layer including a plurality of upper slits, a second electrophoresis liquid having second light blocking particles injected into the plurality of upper slits, and an upper driving electrode pattern disposed to intersect a longitudinal direction of the plurality of upper slits.

11 Claims, 30 Drawing Sheets

(51) Int. Cl.
*G02F 1/1368* (2006.01)
*H10K 59/00* (2023.01)
*H10K 50/86* (2023.01)
*H10K 59/126* (2023.01)
*H10K 59/131* (2023.01)
*G02F 1/1345* (2006.01)
*H01L 27/32* (2006.01)
*H01L 51/52* (2006.01)

(56) References Cited

U.S. PATENT DOCUMENTS

| | | |
|---|---|---|
| 2010/0271721 A1 | 10/2010 | Gaides et al. |
| 2014/0232960 A1 | 8/2014 | Schwartz et al. |
| 2018/0059450 A1* | 3/2018 | Li .................... G02F 1/133512 |
| 2019/0162997 A1 | 5/2019 | Asakura et al. |

FOREIGN PATENT DOCUMENTS

| | | |
|---|---|---|
| CN | 105425502 A | 3/2016 |
| CN | 106353916 A | 1/2017 |
| KR | 10-2007-0003184 A | 1/2007 |
| KR | 10-2010-0060468 B1 | 6/2010 |
| KR | 10-2015-0097332 B1 | 8/2015 |

* cited by examiner

II-II'

DISPLAY APPARATUS

CROSS-REFERENCE TO RELATED APPLICATIONS

This application is a Divisional Application of U.S. patent application Ser. No. 16/523,666 filed on Jul. 26, 2019, which claims the priority benefit of Korean Patent Application Nos. 10-2018-0088103 filed in the Republic of Korean on Jul. 27, 2018, and 10-2018-0172871 filed in the Republic of Korean on Dec. 28, 2018, all of these applications are incorporated herein by reference in their entireties.

BACKGROUND

Field of the Invention

The present disclosure relates to a display apparatus.

Discussion of the Related Art

Display apparatuses, such as a liquid crystal display (LCD), an electroluminescence display, and the like, are easy to implement high resolution and have various advantages as large screen display apparatuses.

Such display apparatuses include a display panel for implementing an image. The display panel includes a plurality of pixels, and each pixel includes a plurality of subpixels that implement individual colors. For example, one pixel may include a red subpixel, a green subpixel, and a blue subpixel.

As wide viewing angle technologies have been developed, display apparatuses may advantageously secure a viewing angle, but in terms of security or improvement of a ghost phenomenon, a film blocking lateral light may be used, and thus, luminance of a display panel deteriorates. For example, in the display apparatus of a related art, an aperture ratio of the display panel may deteriorate and degrade luminance in the process of blocking light emitted to a side surface of the display panel, and thus, in order to implement a high luminance, power consumption increases. Further, a lifetime of the display apparatus of the related art is lowered as power consumption increases.

SUMMARY

Accordingly, the present disclosure is directed to providing a display apparatus that substantially obviates one or more problems due to limitations and disadvantages of the related art.

An aspect of the present disclosure is directed to providing a display apparatus in which light blocking particles are scattered in the entirety of a plurality of slits to thereby control a viewing angle, and light blocking particles are concentrated on a specific portion of a plurality of slits to thereby enhance an aperture ratio of a display panel and ensure visibility.

Another aspect of the present disclosure is directed to providing a display apparatus in which light blocking particles are concentrated on a specific portion of a plurality of slits to implement a wide viewing angle in a first mode to thereby ensure visibility, while reducing power consumption, and light blocking particles are scattered in the entirety of a plurality of slits to implement a narrow viewing angle in a second mode to thereby control a viewing angle.

Another aspect of the present disclosure is directed to providing a display apparatus in which light blocking particles are scattered in the entirety of a plurality of particles to implement a narrow viewing angle to thereby control a viewing angle.

Another aspect of the present disclosure is directed to providing a display apparatus in which a region in which a plurality of slits and a driving electrode pattern overlap is minimized to thereby minimize a region in which light blocking particles are concentrated and maximize an aperture ratio of a display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including: a display panel; and light path control film adhered to the display panel, in which the light path control film includes a plurality of slits, light blocking particles injected into the plurality of slits; and a driving electrode pattern disposed to intersect a longitudinal direction of the plurality of slits and the light blocking particles can concentrate on intersection regions of the plurality of slits and the driving electrode pattern or can be scattered in the entirety of the plurality of slits.

In another aspect of the present disclosure, there is provided a display apparatus including: a display panel including a circuit element layer including a plurality of thin film transistors (TFTs) and an emission element layer connected to each of the plurality of TFTs to form a plurality of emission regions; and a light path control film adhered to the display panel, in which the light path control film includes a plurality of slits, light blocking particles injected into the plurality of slits, and a driving electrode pattern disposed to intersect a longitudinal direction of the plurality of slits, and the light blocking particles can concentrate on intersection regions between the plurality of slits and the driving electrode pattern or can be scattered in the entirety of the plurality of slits.

In another aspect of the present disclosure, there is provided a display apparatus including: a display panel including a lower substrate including a plurality of thin film transistors (TFTs) adjusting light transmittance of each of a plurality of pixels, an upper substrate including a color filter and a black matrix, and a liquid crystal layer interposed between the lower substrate and the upper substrate; a backlight unit irradiating light toward the display panel; and a light path control film interposed between the display panel and the backlight unit, in which the light path control film includes a plurality of slits, light blocking particles injected into the plurality of slits, and a driving electrode pattern disposed to intersect a longitudinal direction of the plurality of slits, and the light blocking particles can concentrate on intersection regions between the plurality of slits and the driving electrode pattern or can be scattered in the entirety of the plurality of slits.

The details of other examples are included in the detailed description and the drawings.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
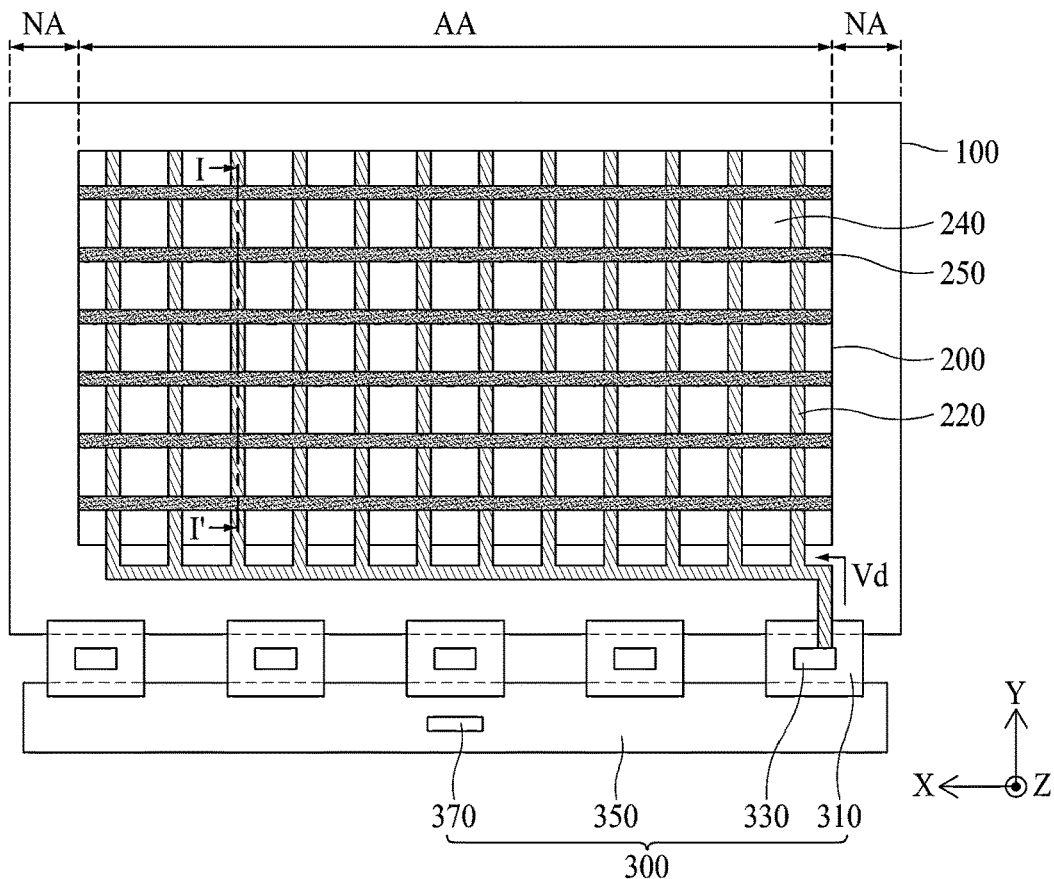
FIG. 1 is a plan view showing a display apparatus according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a situation where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on,"

"over," "under," and "next," one or more other parts may be disposed between the two parts unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc. may be used. The terms are merely for differentiating one element from another element, and the essence, sequence, order, or number of a corresponding element should not be limited by the terms. It will be understood that when an element or layer is described as being "connected," "coupled," or "adhered" to another element or layer, the element or layer can be directly connected or adhered to the other element or layer, but the other element or layer can be "disposed" between elements or layers, or elements or layers can be "connected," "coupled," or "adhered" to each other through the other element or layer.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Examples of the present disclosure will be described with reference to the accompanying drawings and examples.

Figure 2:
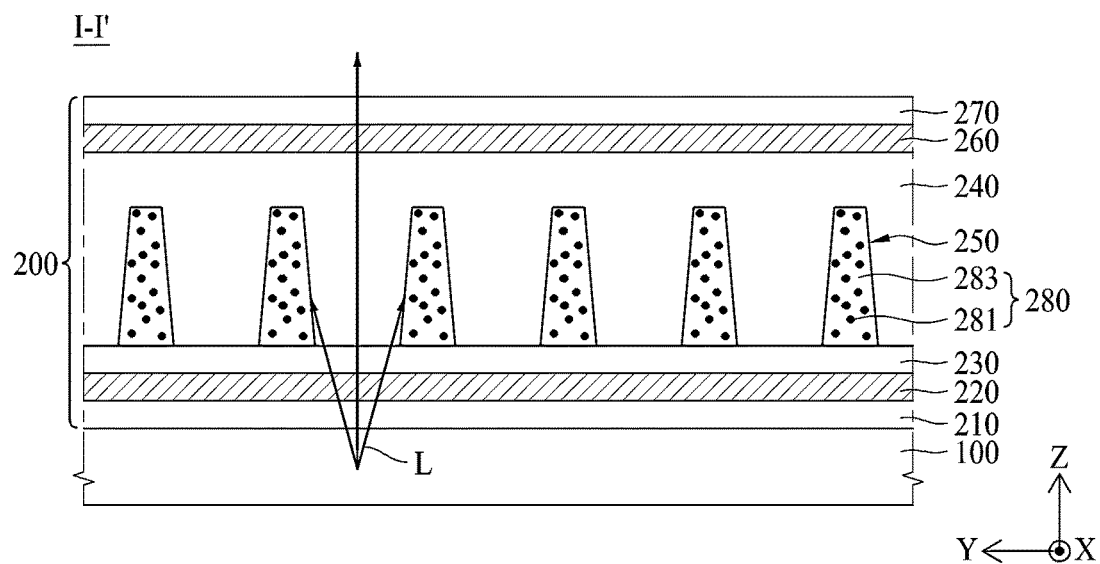
FIG. 2 is a cross-sectional view taken along line I-I' in the display apparatus shown in FIG. 1 according to an embodiment of the present disclosure.
Figure 3:
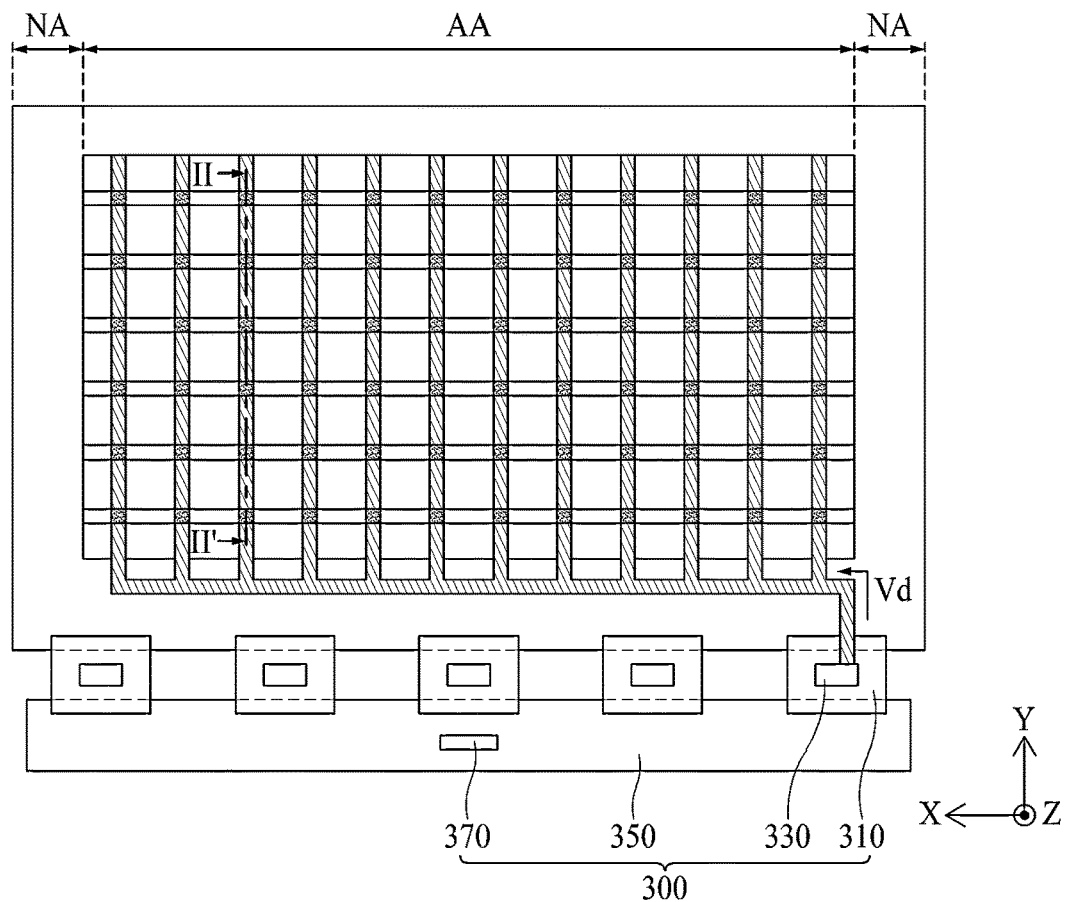
FIG. 3 is a diagram showing a state in which a driving voltage is applied to a driving electrode pattern in the display apparatus shown in FIG. 2 according to an embodiment of the present disclosure.
Figure 4:
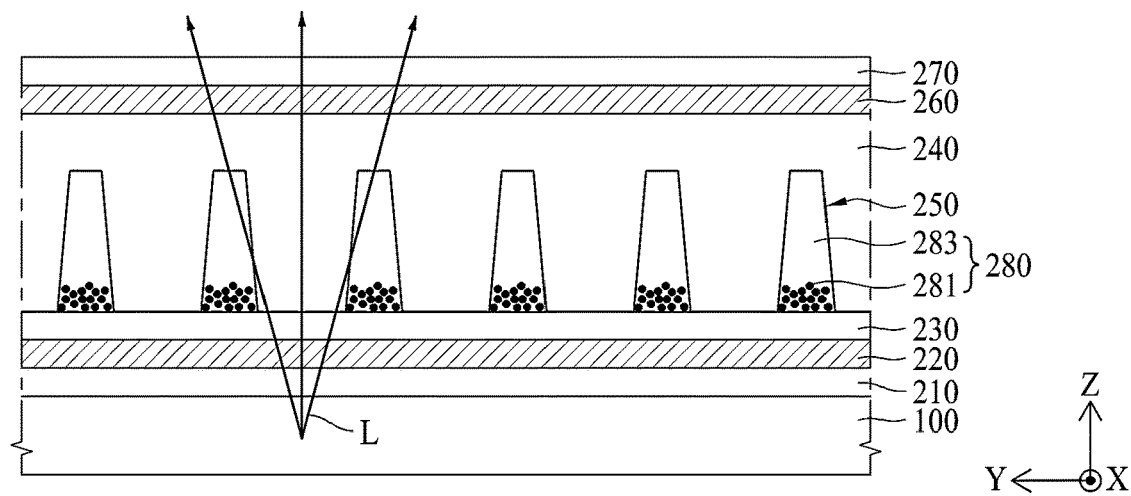
FIG. 4 is a cross-sectional view taken along line II-IF shown in FIG. 3 according to an embodiment of the present disclosure.
Figure 5:
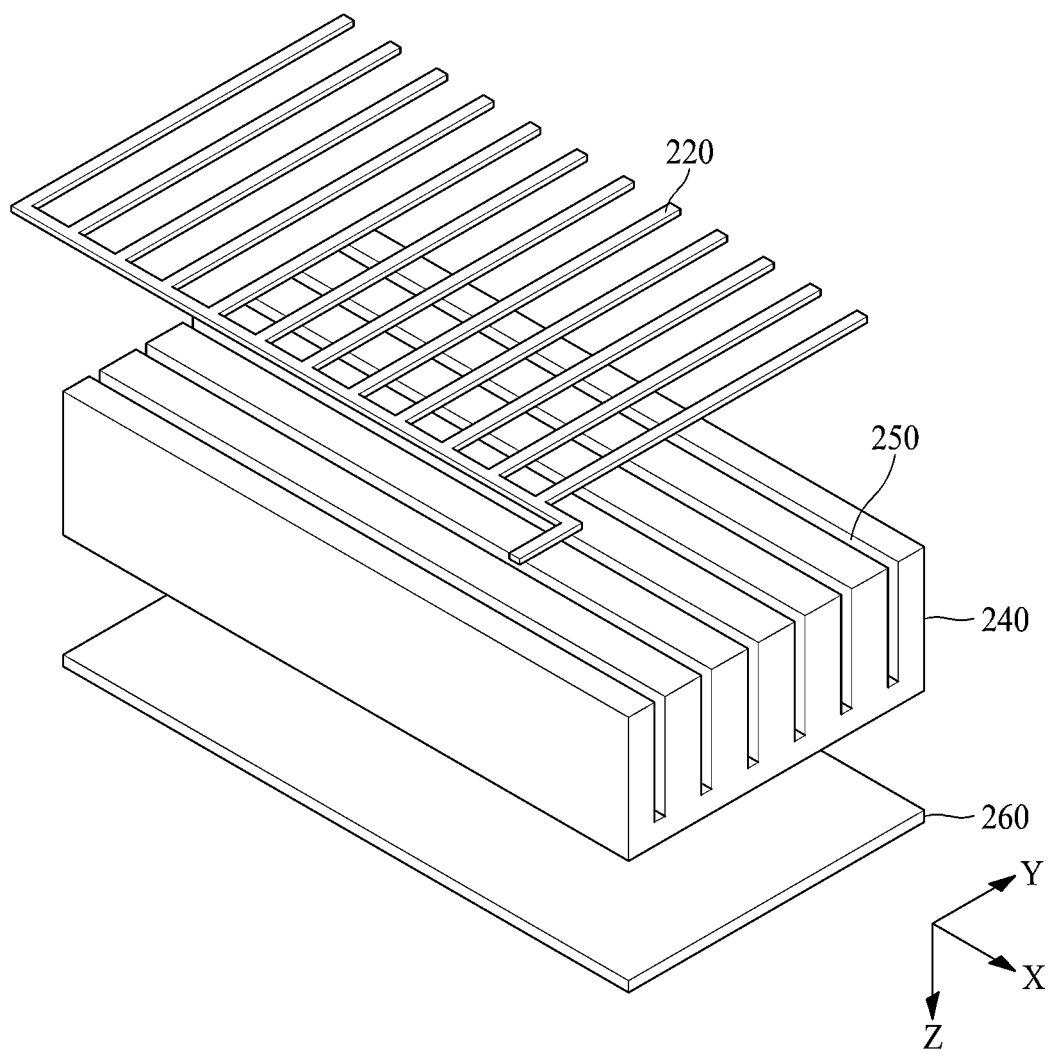
FIG. 5 is a perspective view showing a display apparatus according to an embodiment of the present disclosure.

FIG. 1 is a plan view showing a display apparatus according to a first embodiment of the present disclosure, and FIG. 2 is a cross-sectional view taken along line I-I' in the display apparatus shown in FIG. 1. FIG. 3 is a diagram showing a state in which a driving voltage is applied to a driving electrode pattern in the display apparatus according to the first embodiment, and FIG. 4 is a cross-sectional view taken along line II-II' shown in FIG. 3. Here, FIGS. 1 and 2 show a state in which light blocking particles 281 are scattered in the entire region of the plurality of slits 250, and FIGS. 3 and 4 show a state in which the light blocking particles 281 are concentrated on a region in which a driving electrode pattern 220 and the plurality of slits 250 overlap each other. FIG. 5 is a perspective view showing a display apparatus according to the first embodiment of the present disclosure.

Referring to FIGS. 1 to 5, the display apparatus includes a display panel 100, a light path control film 200, and a display driving circuit section 300.

The display panel 100 can include a display area AA and a non-display area NA. The display area AA is an area where an image is displayed, and can correspond to a central portion of the display panel 100. The non-display area NA is an area where an image is not displayed, and can correspond to an edge portion of the display panel 100 surrounding the display area AA. For example, the display panel 100 can be any type of display panel, such as a liquid crystal display panel, an organic light emitting diode (OLED) display panel, and an electroluminescent display panel.

For example, when the display panel 100 is a liquid crystal display panel, the display panel 100 includes a plurality of gate lines, data lines, and a plurality of pixels formed at intersection regions of the gate lines and the data lines. Here, the display panel 100 includes a lower substrate including thin film transistors, which are switching elements for adjusting light transmittance of the plurality of pixels, respectively, an upper substrate having color filters and/or black matrices, and a liquid crystal layer formed between the lower substrate and the upper substrate.

In another example, when the display panel is an organic light emitting (OLED) display panel, the display panel can include a plurality of gate lines and data lines and a plurality of pixels formed at intersection regions of the gate lines and the data lines. Here, the display panel 100 can include an array substrate including TFTs, which are elements for selectively applying voltages to the plurality of pixels, respectively, an organic light emitting element layer on the array substrate, and an encapsulation substrate disposed on the array substrate to cover the organic light emitting element layer, or the like. The encapsulation substrate can protect the TFTs, the organic light emitting element layer, and the like from external impact and prevent water or oxygen from penetrating into the organic light emitting element layer. A layer formed on the array substrate can include an inorganic light emitting layer, for example, a nano-sized material layer or a quantum dot.

The light path control film 200 can be disposed on a front surface or a rear surface of the display panel 100. The light path control film 200 can be disposed to overlap the display area AA of the display panel 100. According to an example, the light path control film 200 can be adhered to the display panel 100 through an adhesive member or can be provided integrally with the display panel 100.

The light path control film 200 includes a first base film 210, a driving electrode pattern 220, an adhesive layer 230, a plurality of protruding patterns 240, a plurality of slits 250, a common electrode 260, and a second base film 270.

The first base film 210 can support the driving electrode pattern 220. For example, the first base film 210 can be formed of a transparent material, and an upper surface and a lower surface thereof can have a flat structure.

The driving electrode pattern 220 can be patterned on the first base film 210. For example, the driving electrode pattern 220 can be formed of a transparent electrode such as ITO, but is not limited thereto. The driving electrode pattern 220 can face the common electrode 260 with a plurality of slits 250 interposed therebetween and the driving electrode pattern 220 can receive a driving voltage Vd from the display driving circuit section 300.

The driving electrode pattern 220 can be arranged to intersect a longitudinal direction of the plurality of slits 250. According to an example, the driving electrode pattern 220 can be disposed such that a region thereof overlapping the plurality of slits 250 is minimized. For example, if each of the plurality of slits 250 has a line shape extending in a first direction X, the driving electrode pattern 220 can extend in a second direction Y perpendicular to the first direction X. Here, the first direction X corresponds to a horizontal direction and the second direction Y corresponds to a vertical direction, but the present disclosure is not limited thereto. In this manner, the arrangement structure of the driving electrode pattern 220 is changed according to the arrangement structure of the plurality of slits 250, whereby the region in which the driving electrode pattern 220 overlap the plurality of slits 250 can be minimized.

The adhesive layer 230 can adhere the plurality of protruding patterns 240 on the driving electrode pattern 220. That is, the adhesive layer 230 can be interposed between the plurality of protruding patterns 240 and the plurality of slits 250 and the driving electrode pattern 220. For example, the adhesive layer 230 can be an optical clear adhesive (OCA). As another example, the adhesive layer 230 can be an optical clear resin (OCR). Here, the adhesive layer 230 can further include an encapsulant layer interposed between the plurality of protruding patterns 240 and the plurality of slits 250.

The plurality of protruding patterns 240 can be adhered on the driving electrode pattern 220 through the adhesive layer 230. Specifically, the plurality of protruding patterns 240 can be formed on the second base film 270 and the common electrode 260 and then adhered to the driving electrode pattern 220 formed on the first base film 210. When the plurality of protruding patterns 240 are adhered to the driving electrode pattern 220 through the adhesive layer 230, the plurality of slits 250 surrounded by the plurality of protruding patterns 240 and the adhesive layer 230 can be formed. Therefore, each of the plurality of slits 250 can correspond to a concave portion provided between each of the plurality of protruding patterns 240 adjacent to each other.

According to an example, the plurality of protruding patterns 240 can be formed by applying a predetermined material layer on the second base film 270 and the common electrode 260 and then pressing the predetermined material layer using a stamper. Here, the predetermined material layer can correspond to a UV resin or a photoresist. That is, the stamper can form the plurality of protruding patterns 240 and the plurality of slits 250 corresponding to the plurality of protruding patterns 240. In addition, the stamper can determine a shape of the plurality of slits 250 corresponding to the plurality of protruding patterns 240.

The plurality of slits 250 are surrounded by the plurality of protruding patterns 240 and the adhesive layer 230 and each of the plurality of slits 250 can correspond to a concave portion provided between each of the plurality of protruding patterns 240 adjacent to each other. As described above, each of the plurality of slits 250 can have a line shape extending in the first direction X but it is not limited thereto and can be arranged in various forms.

The common electrode 260 can be disposed on the second base film 270. The common electrode 260 can be a transparent electrode such as ITO, but is not limited thereto. The common electrode 260 can be formed as one electrode covering the entire surface of the second base film 270 or can be formed to correspond to the driving electrode pattern 220. The common electrode 260 can face the driving electrode pattern 220 with the plurality of protruding patterns 240 and the plurality of slits 250 interposed therebetween. For example, the common electrode 260 can be supplied with a low potential voltage lower than the driving voltage Vd or can be grounded.

The second base film 270 can support the common electrode 260 and the plurality of protruding patterns 240 before being bonded to the first base film 210. For example, the second base film 270 can be formed of a transparent material, and an upper surface and a lower surface thereof can have a flat structure.

An electrophoresis liquid 280 can be prepared by mixing light blocking particles 281 and a transparent fluid 283. When the first base film 210 and the second base film 270 are adhered together to form the plurality of slits 250 surrounded by the plurality of protruding patterns 240 and the adhesive layer 230, the electrophoresis liquid 280 can be injected into the plurality of slits 250.

The light blocking particles 281 can include an electrophoretic material moving in a direction toward the driving electrode pattern 220 when the driving voltage Vd is applied to the driving electrode pattern 220. That is, the light blocking particles 281 can have a light blocking (or light absorption) characteristic, while having an electrophoresis characteristic. According to an example, the light blocking particles 281 can block (or absorb) a partial amount of light L emitted from the display panel 100. For example, the light blocking particles 281 can be formed of carbon black having a high light absorbance and a high electrical conductivity, but the present disclosure is not limited thereto. The transparent fluid 283 can allow light to be transmitted therethrough, flow in the plurality of slits 250, and support movement of the light blocking particles 281.

For example, when the light blocking particles 281 are formed of carbon black and a proportion of the light blocking particles 281 in the electrophoresis liquid 280 is 3.5%, the light path control film 200 can have a transmittance as shown in [Table 1] below.

TABLE 1

|  |  | Gap 5 μm | Gap 10 μm | Gap 15 μm | Gap 20 μm |
|---|---|---|---|---|---|
| Sample 1 | Luminance [nit] | 138 | 32.7 | 15.5 | 7.2 |
|  | Transmittance [%] | 2.46 | 0.58 | 0.28 | 0.13 |
| Sample 2 | Luminance [nit] | 139.7 | 24.8 | 23.2 | 3.6 |
|  | Transmittance [%] | 2.49 | 0.44 | 0.41 | 0.06 |
| Sample 3 | Luminance [nit] | — | 12.2 | 25.2 | 5.4 |
|  | Transmittance [%] | — | 0.22 | 0.45 | 0.10 |
| Average transmittance [%] |  | 2.52 | 0.42 | 0.36 | 0.10 |

Here, Samples 1 to 3 correspond to samples in which a proportion of the light blocking particles 281 in the electrophoresis liquid 280 is the same as 3.5%, and the gap corresponds to a width of the plurality of slits 250. That is, as the width of the plurality of slits 250 increases, transmittance of the light path control film 200 can decrease. However, if the width of the plurality of slits 250 increases, it is easy to implement a narrow viewing angle mode, and thus, the width of the plurality of slits 250 can be designed to facilitate implement the narrow viewing angle mode, while minimizing a reduction in transmittance of the light path control film 200.

For example, if the light blocking particles 281 are formed of carbon black and the proportion of the light blocking particles 281 in the electrophoresis liquid 280 is 5%, the electrophoresis liquid 280 can have a transmittance as shown in [Table 2] below.

TABLE 2

|  |  | Gap 5 μm | Gap 10 μm | Gap 15 μm | Gap 20 μm |
|---|---|---|---|---|---|
| Sample 4 | Luminance [nit] | 38 | 9.2 | 3.5 | 0.8 |
|  | Transmittance [%] | 0.68 | 0.16 | 0.06 | 0.01 |
| Sample 5 | Luminance [nit] | 33 | 5.4 | 1.5 | 2.5 |
|  | Transmittance [%] | 0.59 | 0.10 | 0.03 | 0.04 |
| Sample 6 | Luminance [nit] | 13.6 | 35.7 | 4.5 | 1.9 |
|  | Transmittance [%] | 0.24 | 0.64 | 0.08 | 0.03 |
| Average transmittance [%] |  | 0.50 | 0.30 | 0.06 | 0.03 |

Here, Samples 4 to 6 correspond to samples in which the proportion of the light blocking particles 281 in the electrophoresis liquid 280 is the same as 5% and the Gap corresponds to the width of the plurality of slits 250. That is, as the width of the plurality of slits 250 increases, the transmittance of the light path control film 200 can decrease. In addition, in comparison between [Table 1] and [Table 2], as the ratio of the light blocking particles 281 in the electrophoresis liquid 280 is increased, the transmittance of the light path control film 200 can be reduced. As described above, the ratio of the light blocking particles 281 in the electrophoresis liquid 280 and the widths of the plurality of slits 250 can be designed to facilitate implementation of a narrow viewing angle mode, while minimizing the reduction in the transmittance of the light path control film 200.

As shown in FIGS. 1 and 2, the light blocking particles 281 can be scattered in the entire region of the plurality of slits 250 unless the driving voltage Vd is applied to the driving electrode pattern 220. Specifically, when the light blocking particles 281 are scattered in the entire region of the plurality of slits 250 (e.g., in a state in which the light blocking particles 281 are freely and evenly disbursed within the slits), the light blocking particles 281 can block a partial amount of light L emitted from the display panel 100. For example, light L emitted to the front of the display panel 100 is not blocked by the light blocking particles 281 and light L emitted in a direction except for the front of the display panel 100 (e.g., front diagonal direction) can be blocked by the light blocking particles 281. That is, the light path control film 200 can scatter the light blocking particles 281 in the entire region of the plurality of slits 250 to control a wide viewing angle of the display apparatus.

As shown in FIGS. 3 and 4, when the driving voltage Vd is applied to the driving electrode pattern 220, the light blocking particles 281 can concentrate on an overlapping region (or intersection region) of the driving electrode pattern 220 and the plurality of slits 250 (e.g., the driving voltage Vd applied to the driving electrode pattern 220 can generate an electric field and the light blocking particles 281 can move to one side of the slits corresponding to areas that directly overlap with the driving electrode pattern 220). For example, the regions where the light blocking particles 281 concentrate can be disposed to be spaced apart from each other in the plan view. In addition, only the transparent fluid 283 may remain in a region of the plurality of slits 250 that does not intersect the driving electrode pattern 220. Specifically, the driving electrode pattern 220 can receive the driving voltage Vd from a driving integrated circuit 330 of the display driving circuit section 300, and the light blocking particles 281 can concentrate on the shortest distance between the driving electrode pattern 220 and the plurality of slits 250 (e.g., where the light blocking particles can become closest to the driving electrode pattern). That is, the light blocking particles 281 can move from the region where the driving electrode pattern 220 and the plurality of slits 250 do not overlap to the region where the driving electrode pattern 220 and the plurality of slits 250 overlap each other with respect to a plane direction. Also, the light blocking particles 281 can move toward the driving electrode pattern 220 with respect to a direction perpendicular to the plane direction. When the light blocking particles 281 concentrate on the shortest distance between the driving electrode pattern 220 and the plurality of slits 250, only the transparent fluid 283 may remain in the remaining area of the plurality of slits 250. When the light blocking particles 281 concentrate on the overlap region of the driving electrode pattern 220 and the plurality of slits 250, the light path control film 200 can allow the light L emitted from the display panel 100 to be transmitted therethrough. For example, the light L emitted in the front and front diagonal directions of the display panel 100 can be transmitted through the light path control film 200 without being blocked by the light blocking particles 281. That is, the light path control film 200 can concentrate the light blocking particles 281 on the overlapping region of the driving electrode pattern 220 and the plurality of slits 250 to enhance an aperture ratio of the display panel 100.

Therefore, the light path control film 200 can determine whether to concentrate the light blocking particles depending on whether the driving voltage Vd is applied, thereby selectively controlling a wide viewing angle or an aperture ratio of the display panel. As a result, the light path control film 200 can determine whether to concentrate the light blocking particles, whereby field visibility can be ensured and power consumption can be reduced to lengthen the life of the display apparatus.

According to an example, in a first mode, the light path control film 200 can concentrate the light blocking particles 281 on the shortest distance between the driving electrode pattern 220 and the plurality of slits 250 to allow the light emitted from the display panel 100 to be transmitted therethrough, and in a second mode, the light path control film 200 can scatter the light blocking particles 281 in the entire region of the plurality of slits 250 to block a partial amount of the light emitted from the display panel 100. Here, the light path control film 200 can control the wide viewing angle through the second mode, and the aperture ratio of the display panel 100 can be improved through the first mode. For example, the first mode may correspond to the wide viewing angle mode or a daytime mode and the second mode can correspond to a narrow viewing angle mode or a nighttime mode, but is not limited thereto. As described above, the light path control film 200 can implement high brightness without increasing power consumption for driving the display panel 100 by improving the aperture ratio of the display panel 100 in the first mode. By controlling the wide viewing angle in the second mode, the light path control film 200 can prevent an image of the display panel 100 from being reflected on another place (for example, a glass disposed near the display panel 100). As a result, the light path control film 200 can improve the aperture ratio of the display panel or control the wide viewing angle by selecting one of the first mode and the second mode.

The display driving circuit section 300 can include a plurality of circuit films 310, a plurality of driving integrated circuits 330, a printed circuit board (PCB) 350, and a timing controller 370.

Each of the plurality of circuit films 310 can be adhered to a pad part of the display panel 100 and the PCB 350. For example, an input terminal provided on one side of each of the plurality of circuit films 310 can be adhered to the PCB 350 by a film adhering process, and an output terminal provided on the other side of the plurality of circuit films 310 can be adhered to the pad part of the display panel 100 by a film adhering process.

The plurality of driving integrated circuits 330 can be individually mounted on the plurality of circuit films 310, respectively. Each of the plurality of driving integrated circuits 330 receives pixel data and a data control signal provided from the timing controller 370, converts the pixel data into an analog pixel data signal according to a data control signal for each pixel, and supplies the converted signal to a corresponding data line.

According to an example, one of the plurality of driving integrated circuits 330 can provide the driving voltage Vd applied to the driving electrode pattern 220 while providing a data voltage to the plurality of thin film transistors. The light path control film 200 does not require a separate driving integrated circuit and can receive the driving voltage Vd by the driving electrode pattern 220 through the driving integrated circuit 330 of the display driving circuit section 300 for driving the display panel 100.

The printed circuit board 350 supports the timing controller 370 and can transmit signals and power between the components of the display driving circuit section 300.

The timing controller 370 is mounted on the printed circuit board 350 and can receive image data and a timing synchronization signal provided from the display driving system through the user connector provided on the printed circuit board 350. The timing controller 370 can generate a data control signal and a scan control signal based on the timing synchronization signal, control a driving timing of each of the driving integrated circuits 330 through the data control signal, and control a driving timing of the scan driving circuit through a scan control signal.

Figure 6:
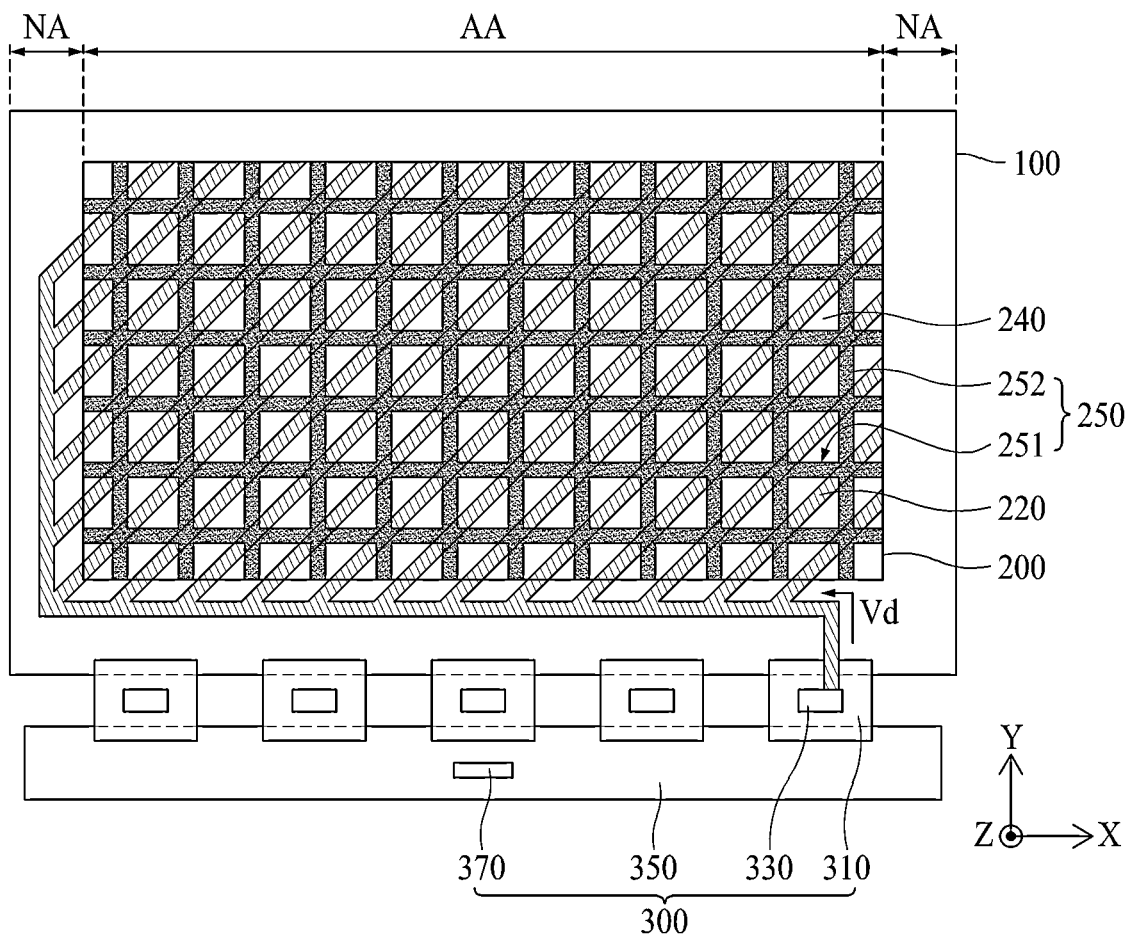
FIG. 6 is a plan view showing a display apparatus according to another embodiment of the present disclosure.
Figure 7:
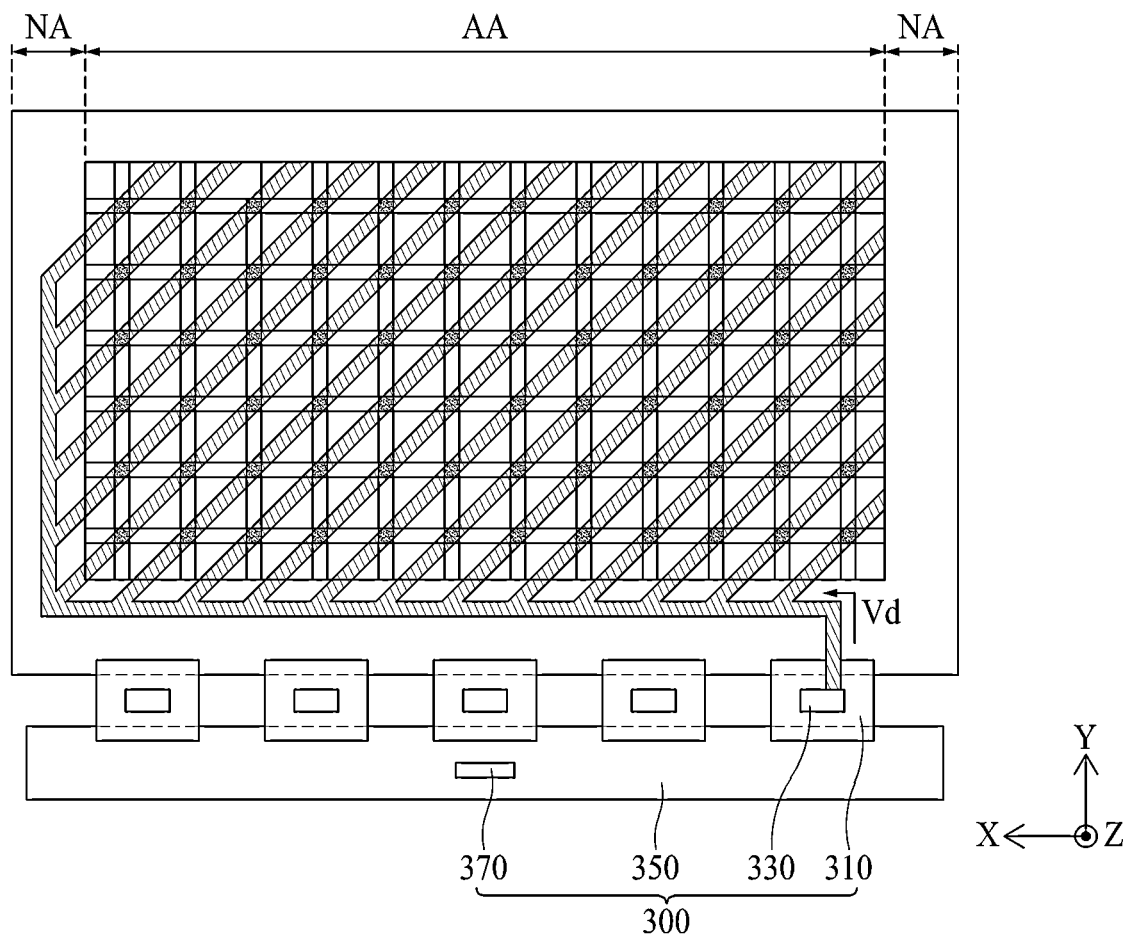
FIG. 7 is a diagram showing a state in which a driving voltage is applied to a driving electrode pattern in the display apparatus according to an embodiment of the present disclosure.
Figure 8:
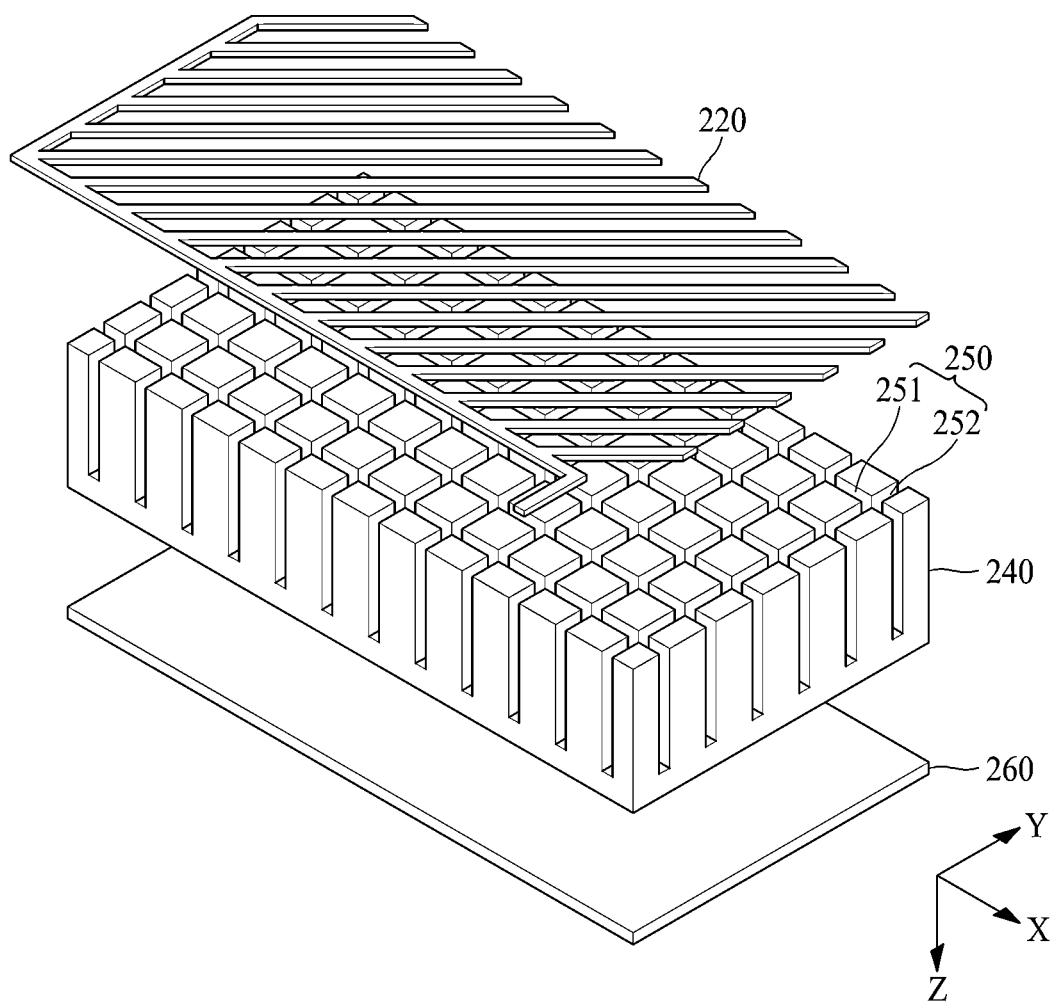
FIG. 8 is a perspective view showing a display apparatus according to an embodiment of the present disclosure.

FIG. 6 is a plan view showing a display apparatus according to a second embodiment of the present disclosure, FIG. 7 is a view showing a state in which a driving voltage is applied to a driving electrode pattern in a display apparatus according to the second embodiment of the present disclosure, and FIG. 8 is a perspective view showing a display apparatus according to the second embodiment of the present disclosure. The second embodiment of FIGS. 6 to 8 differs from the first embodiment of FIGS. 1 to 5 in a configuration of the driving electrode pattern 220, the plurality of protruding patterns 240, and the plurality of slits 250, and the same components as those of the above-described components will be briefly described or omitted. For example, each of the plurality of slits 250 of the display apparatus of FIGS. 1 to 5 has a line shape extending in the first direction, and the plurality of slits 250 of the display apparatus of FIGS. 6 to 8 can include a plurality of first slits 251 extending in the first direction X and a plurality of second slits 252 extending in the second direction Y perpendicular to the first direction X (e.g., the first and second slits can form a grid type pattern of grooves between the protruding patterns 240).

Referring to FIGS. 6 to 8, the plurality of protruding patterns 240 can be adhered to the driving electrode pattern 220 through the adhesive layer 230. Specifically, the plurality of protruding patterns 240 can be formed on the second base film 270 and the common electrode 260 and then adhered to the driving electrode pattern 220 formed on the first base film 210. When the plurality of protruding patterns 240 are adhered to the driving electrode pattern 220 through the adhesive layer 230, the plurality of protruding patterns 240 and a plurality of slits 250 surrounded by the adhesive layer 230 can be formed. Therefore, each of the plurality of slits 250 can correspond to a concave portion provided between each of the plurality of protruding patterns 240 adjacent to each other.

The plurality of slits 250 are surrounded by the plurality of protruding patterns 240 and the adhesive layer 230 and each of the plurality of slits 250 can correspond to a concave portion provided between each of the plurality of adjacent protruding patterns 240. For example, the plurality of slits 250 can include a plurality of first slits 251 extending in the first direction X and a plurality of second slits 252 extending in the second direction Y perpendicular to the first direction X. That is, when the first and second slits 251 and 252 has a lattice shape extending in the first direction X and the second direction Y, respectively, the driving electrode pattern 220 can extend in a diagonal direction between the direction X and the second direction Y. Accordingly, the driving electrode pattern 220 can extend in the direction in which the region overlapping the plurality of slits 250 is minimized. Since the arrangement structure of the driving electrode pattern 220 is changed according to the arrangement structure of the plurality of slits 250, the region where the driving electrode pattern 220 overlap the plurality of slits 250 can be minimized and the area where the light blocking particles 281 are concentrated can be minimized to improve the aperture ratio of the display panel 100.

As described above, each of the plurality of slits 250 can have a lattice shape extending in the first direction X and the second direction Y that intersects the first direction X, but the present disclosure is not limited thereto and the plurality of slits 250 can be arranged in various forms.

As shown in FIG. 6, if the driving voltage Vd is not applied to the driving electrode pattern 220, the light blocking particles 281 can be scattered in the entire region of the first and second slits 251 and 252. Specifically, when the light blocking particles 281 are scattered in the entire region of the first and second slits 251 and 252, the light blocking particles 281 can block a partial amount of the light emitted from the display panel 100. That is, the light path control film 200 can scatter the light blocking particles 281 in the entire region of the first and second slits 251 and 252, thereby controlling the wide viewing angle of the display apparatus.

As shown in FIG. 7, when the driving voltage Vd is applied to the driving electrode pattern 220, the light blocking particles 281 can be concentrated on the overlapping region (or intersection region) of the driving electrode pattern 220 and the plurality of first and second slits 251 and 252. In addition, only the transparent fluid 283 may remain in a region of the plurality of first and second slits 251 and 252 that does not intersect the driving electrode pattern 220. Specifically, the driving electrode pattern 220 can receive the driving voltage Vd from a driving integrated circuit 330 of the display driving circuit section 300, and the light blocking particles 281 can concentrate on the shortest distance between the driving electrode pattern 220 and the plurality of first and second slits 251 and 252. That is, the light blocking particles 281 can move from the region where the driving electrode pattern 220 and the plurality of first and second slits 251 and 252 do not overlap to the region where the driving electrode pattern 220 and the plurality of first and second slits 251 and 252 overlap each other with respect to a plane direction. Also, the light blocking particles 281 can move toward the driving electrode pattern 220 with respect to a direction perpendicular to the plane direction. When the light blocking particles 281 concentrate on the shortest distance between the driving electrode pattern 220 and the plurality of first and second slits 251 and 252, only the transparent fluid 283 may remain in the remaining area of the plurality of first and second slits 251 and 252. When the light blocking particles 281 concentrate on the overlap region of the driving electrode pattern 220 and the plurality of first and second slits 251 and 252, the light path control film 200 can allow the light emitted from the display panel 100 to be transmitted therethrough. For example, the light emitted in the front and front diagonal directions of the display panel 100 can be transmitted through the light path control film 200 without being blocked by the light blocking particles 281. That is, the light path control film 200 can concentrate the light blocking particles 281 on the overlapping region of the driving electrode pattern 220 and the plurality of first and second slits 251 and 252 to enhance an aperture ratio of the display panel 100.

Figure 9:
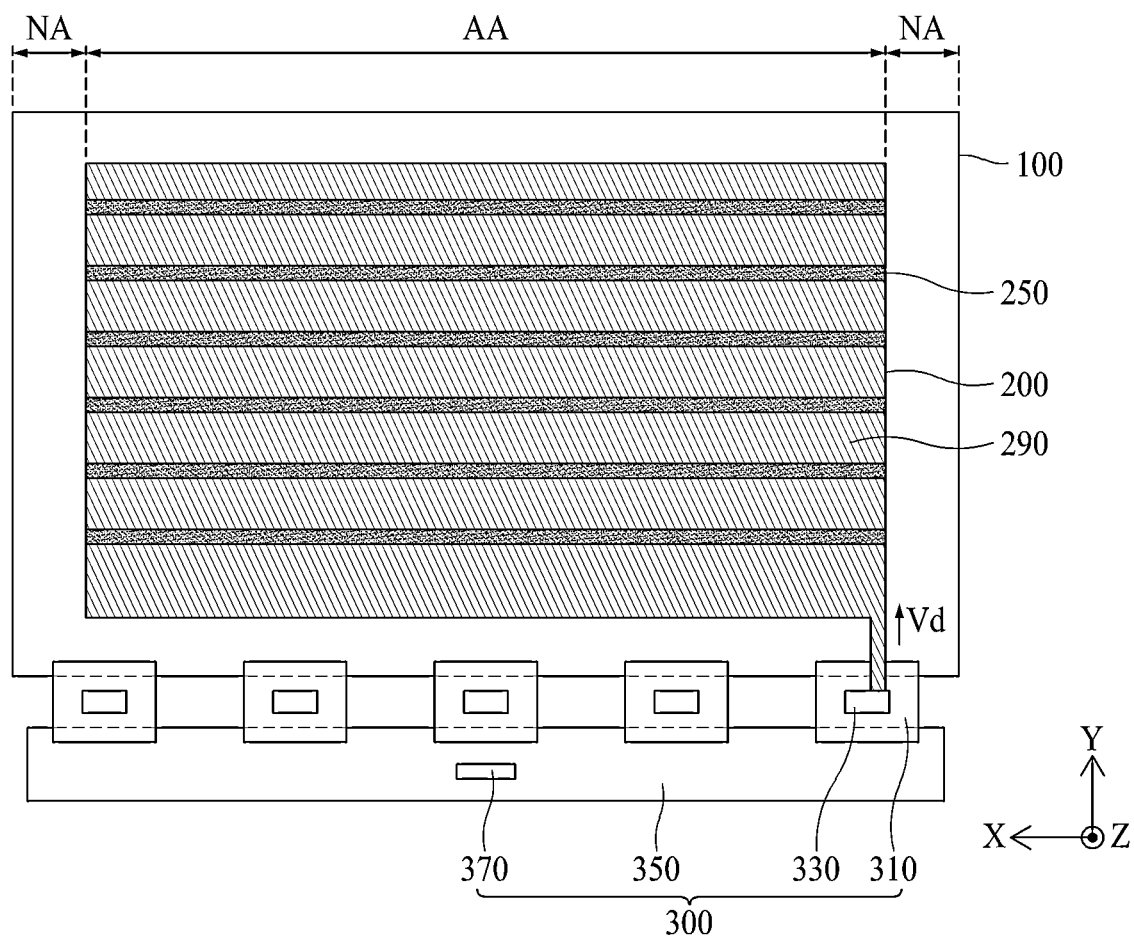
FIG. 9 is a plan view showing a display apparatus according to another embodiment of the present disclosure.
Figure 10:
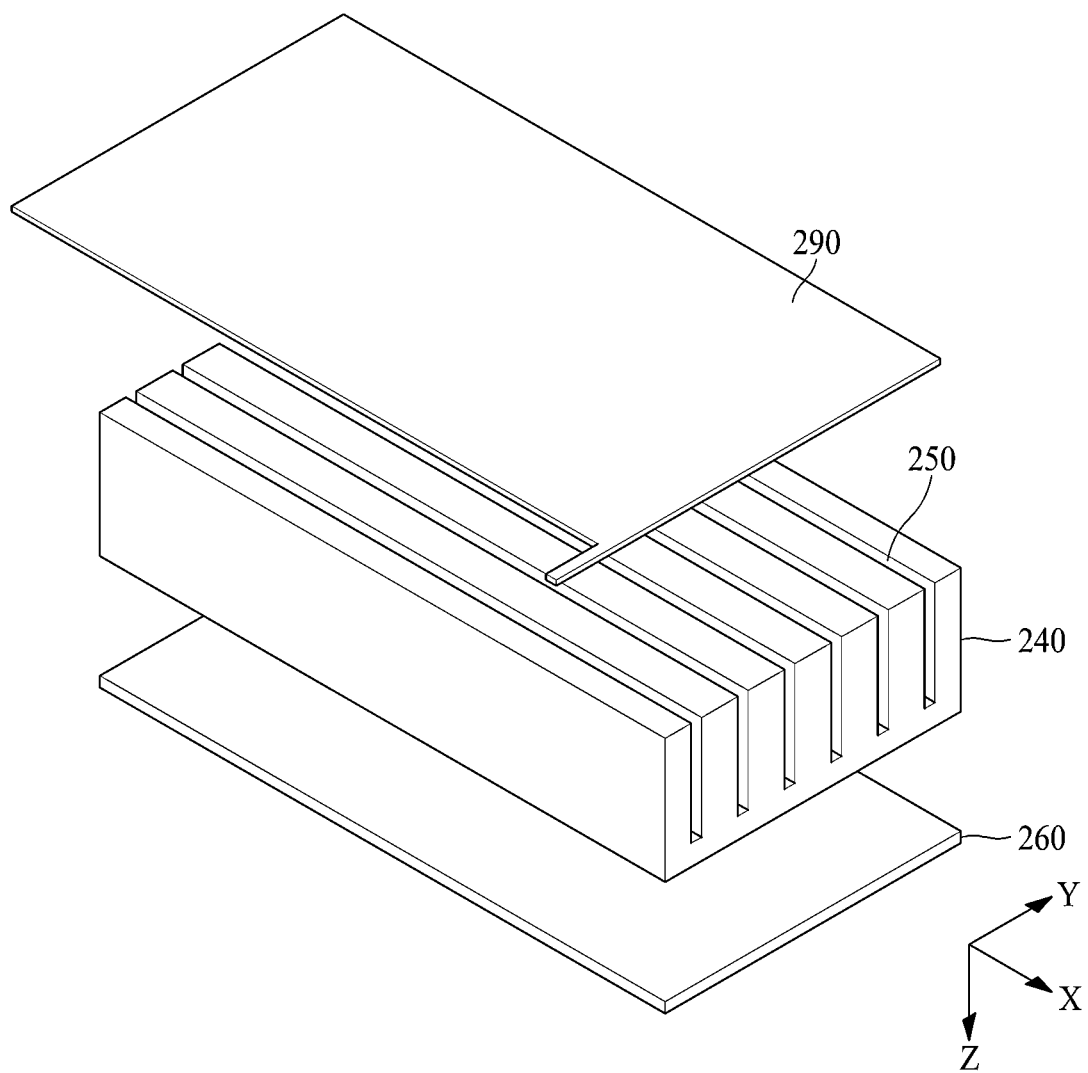
FIG. 10 is a perspective view showing a display apparatus according to an embodiment of the present disclosure.

FIG. 9 is a plan view showing a display apparatus according to a third embodiment of the present disclosure, and FIG. 10 is a perspective view showing a display apparatus according to the third embodiment of the present disclosure. The display apparatus of FIG. 9 includes a driving lump electrode 290 instead of the driving electrode pattern 220 of the display apparatus of FIG. 1, and the same configuration as that of the above-described configuration will be briefly described or omitted.

The light path control film 200 includes a first base film 210, an adhesive layer 230, the plurality of protruding patterns 240, a plurality of slits 250, a common electrode 260, a second base film 270, and a driving lump electrode 290.

The first base film 210 can support the driving lump electrode 290. For example, the first base film 210 can be formed of a transparent material, and the upper surface and the lower surface can have a flat structure.

The driving lump electrode 290 can be disposed on the first base film 210. For example, the driving lump electrode 290 can be formed of a transparent electrode such as ITO, but is not limited thereto. According to an example, the driving lump electrode 290 can be formed as one electrode covering the entire surface of the first base film 210 (e.g., the driving lump electrode 290 can be a plate type electrode). The driving lump electrode 290 can face the common electrode 260 with a plurality of slits 250 interposed therebetween and the driving lump electrode 290 can receive the driving voltage Vd from the display driving circuit section 300.

The adhesive layer 230 can adhere the plurality of protruding patterns 240 on the driving lump electrode 290. That is, the adhesive layer 230 can be interposed between the plurality of protruding patterns 240 and the plurality of slits 250 and the driving lump electrode 290. For example, the adhesive layer 230 can be an optical clear adhesive (OCA). As another example, the adhesive layer 230 can be an optical clear resin (OCR). Here, the adhesive layer 230 can further include an encapsulant layer interposed between the plurality of protruding patterns 240 and the plurality of slits 250.

The plurality of protruding patterns 240 can be adhered on the driving lump electrode 290 through the adhesive layer 230. Specifically, the plurality of protruding patterns 240 can be formed on the second base film 270 and the common electrode 260 and then adhered to the driving lump electrode 290 formed on the first base film 210. When the plurality of protruding patterns 240 are adhered to the driving lump electrode 290 through the adhesive layer 230, the plurality of slits 250 surrounded by the plurality of protruding patterns 240 and the adhesive layer 230 can be formed. Therefore, each of the plurality of slits 250 can correspond to a concave portion provided between each of the plurality of protruding patterns 240 adjacent to each other.

The plurality of slits 250 are surrounded by the plurality of protruding patterns 240 and the adhesive layer 230 and each of the plurality of slits 250 can correspond to a concave portion provided between each of the plurality of protruding patterns 240 adjacent to each other. As described above, each of the plurality of slits 250 can have a line shape extending in the first direction X but it is not limited thereto and can be arranged in various forms.

The common electrode 260 can be disposed on the second base film 270. The common electrode 260 can be a transparent electrode such as ITO, but is not limited thereto. The common electrode 260 can be formed as one electrode covering the entire surface of the second base film 270. The common electrode 260 can face the driving lump electrode 290 with the plurality of protruding patterns 240 and the plurality of slits 250 interposed therebetween. For example, the common electrode 260 can be supplied with a low potential voltage lower than the driving voltage Vd or can be grounded.

The second base film 270 can support the common electrode 260 and the plurality of protruding patterns 240 before being bonded to the first base film 210. For example, the second base film 270 can be formed of a transparent material, and an upper surface and a lower surface thereof can have a flat structure.

An electrophoresis liquid 280 can be prepared by mixing light blocking particles 281 and a transparent fluid 283. When the first base film 210 and the second base film 270 are adhered together to form the plurality of slits 250 surrounded by the plurality of protruding patterns 240 and the adhesive layer 230, the electrophoresis liquid 280 can be injected into the plurality of slits 250.

Figure 11:
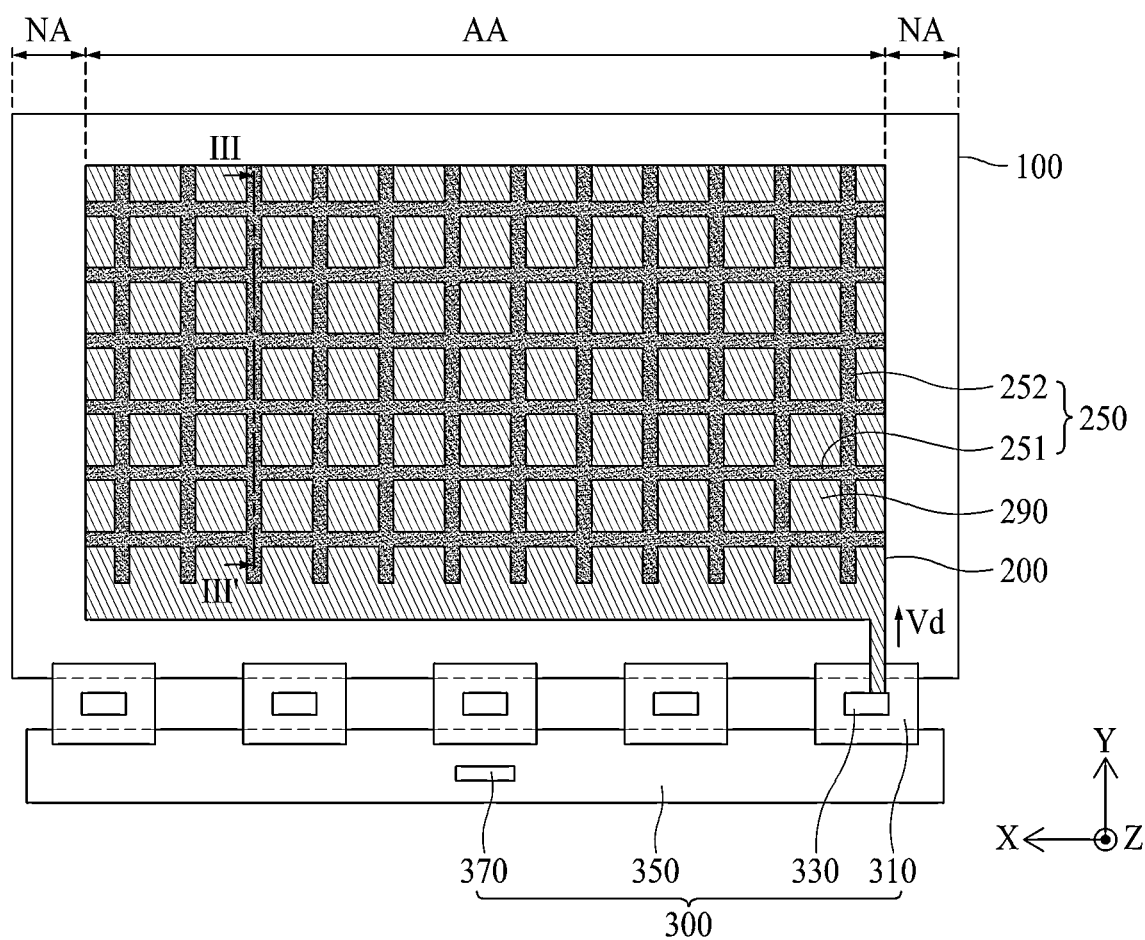
FIG. 11 is a plan view showing a display apparatus according to another embodiment of the present disclosure.
Figure 12:
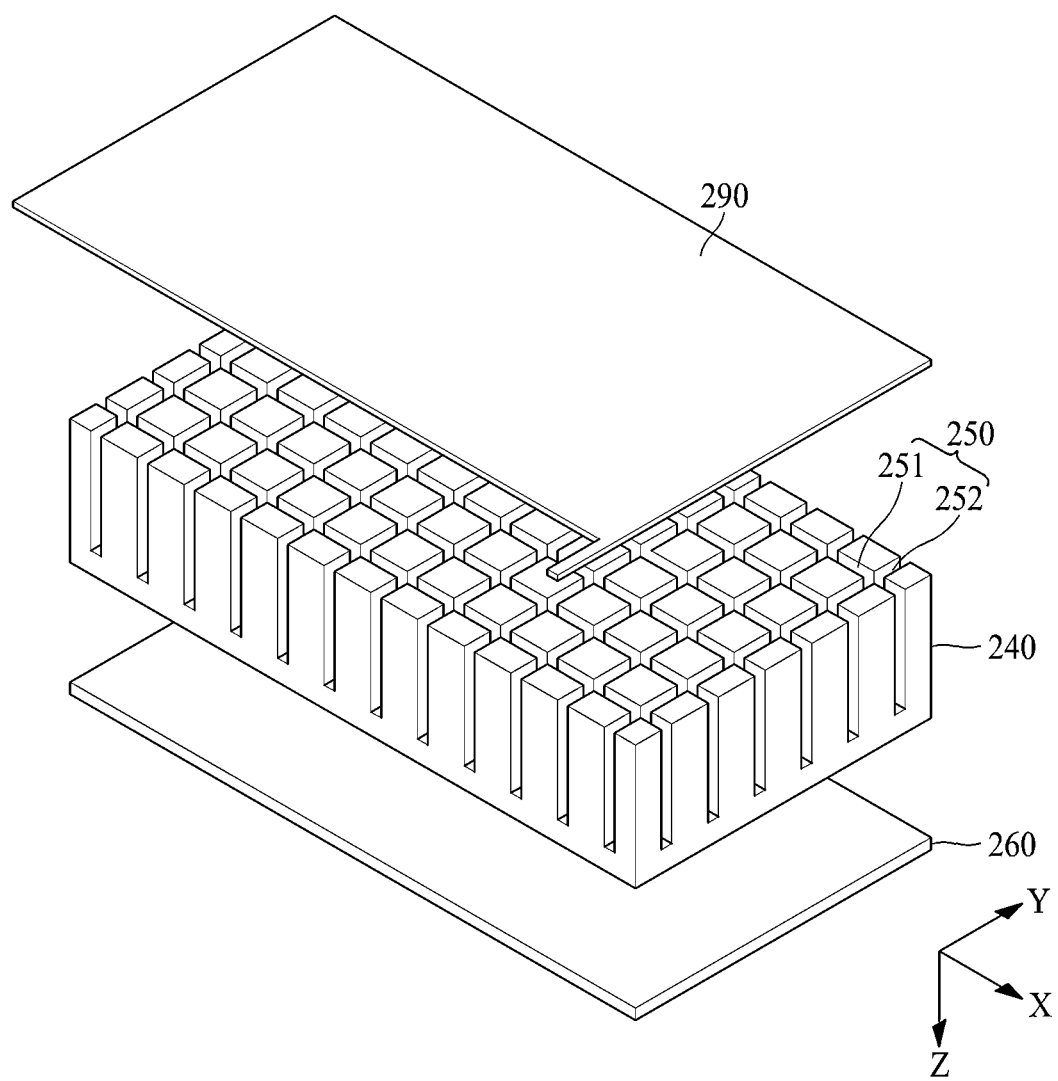
FIG. 12 is a perspective view showing a display apparatus according to another embodiment of the present disclosure.

FIG. 11 is a plan view showing a display apparatus according to a fourth embodiment of the present disclosure, and FIG. 12 is a perspective view showing a display apparatus according to the fourth embodiment of the present disclosure. Here, the display apparatus of FIGS. 11 and 12 is different from the configuration of the plurality of protruding patterns 240 and the plurality of slits 250 of the display apparatus of FIGS. 9 and 10, and the same configuration as the above-described configuration will be briefly described or omitted. For example, each of the plurality of slits 250 of the display apparatus of FIGS. 9 and 10 has a line shape extending in the first direction, and the plurality of slits 250 of the display apparatus of FIGS. 11 and 12 can include a plurality of first slits 251 extending in the first direction X and a plurality of second slits 252 extending in the second direction Y perpendicular to the first direction X.

Referring to FIGS. 11 and 12, the plurality of protruding patterns 240 can be adhered on the driving lump electrode 290 through the adhesive layer 230. Specifically, the plurality of protruding patterns 240 can be formed on the second base film 270 and the common electrode 260 and then adhered to the driving lump electrode 290 formed on the first base film 210. When the plurality of protruding patterns 240 are adhered to the driving electrode pattern 220 through the adhesive layer 230, the plurality of slits 250 surrounded by the plurality of protruding patterns 240 and the adhesive layer 230 can be formed. Therefore, each of the plurality of slits 250 can correspond to a concave portion provided between each of the plurality of protruding patterns 240 adjacent to each other.

The plurality of slits 250 are surrounded by the plurality of protruding patterns 240 and the adhesive layer 230 and each of the plurality of slits 250 can correspond to a concave portion provided between the plurality of adjacent protruding patterns 240. For example, the plurality of slits 250 can include a plurality of first slits 251 extending in the first direction X and a plurality of second slits 252 extending in the second direction Y perpendicular to the first direction X. According to an example, each of the plurality of slits 250 can have a lattice shape extending in the first direction X and the second direction Y that intersects the first direction X, but the present disclosure is not limited thereto and the plurality of slits 250 can be arranged in various forms.

Figure 13:
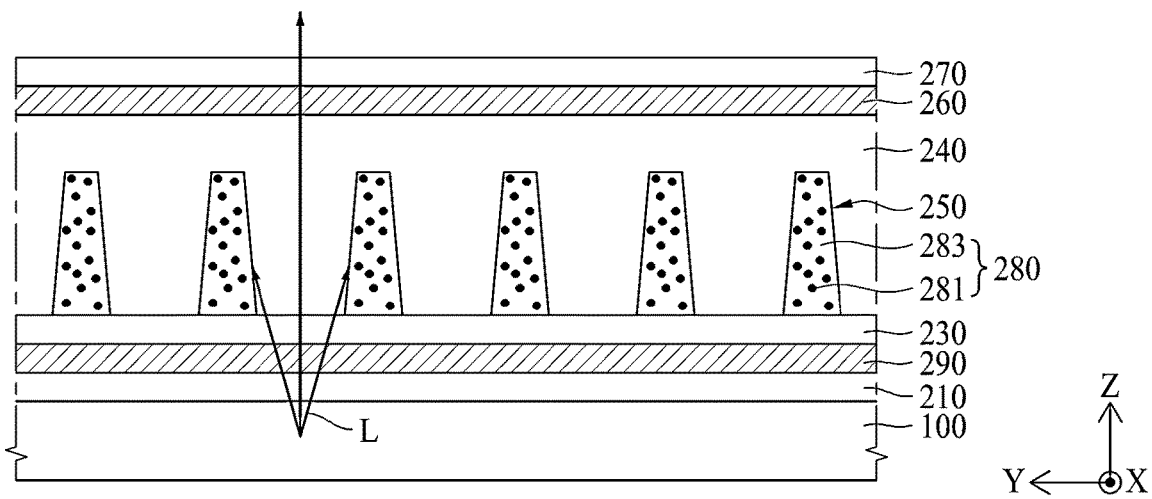
FIG. 13 shows an example of a cross-sectional view taken along line shown in FIG. 11 according to an embodiment of the present disclosure.

FIG. 13 is an example of a cross-sectional view taken along line shown in FIG. 11.

Referring to FIG. 13, the light blocking particles 281 can be scattered in the entire region of the plurality of first and second slits 251 and 252 unless the driving voltage Vd is applied to the driving lump electrode 290. Specifically, when the light blocking particles 281 are scattered in the entire region of the plurality of slits 250, the light blocking particles 281 can block a partial amount of light L emitted from the display panel 100. That is, the light path control film 200 can scatter the light blocking particles 281 in the entire region of the plurality of first and second slits 251 and 252 to control a wide viewing angle of the display apparatus.

Figure 14:
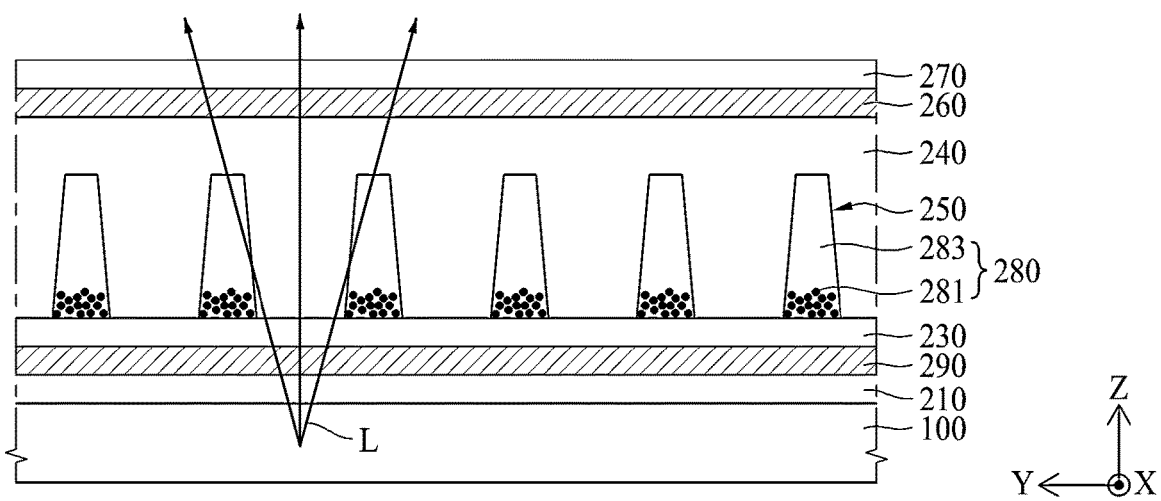
FIG. 14 shows another example of a cross-sectional view taken along line III-III' shown in FIG. 11 according to an embodiment of the present disclosure.

FIG. 14 shows another example of a cross-sectional view taken along line III-III' shown in FIG. 11.

Referring to FIG. 14, when the driving voltage Vd is applied to the driving lump electrode 290, the light blocking particles 281 can concentrate on an overlapping region (or intersection region) of the driving lump electrode 290 and the plurality of first and second slits 251 and 252. Specifically, the driving lump electrode 290 can receive the driving voltage Vd from the driving integrated circuit 330 of the display driving circuit section 300, and the light blocking particles 281 can concentrate on the shortest distance between the driving lump electrode 290 and the plurality of first and second slits 251 and 252. Here, only the transparent fluid 283 may remain in a region of the plurality of first and second slits 251 and 252 that is relatively far from the driving lump electrode 290. That is, the light blocking particles 281 can move to be close to the driving lump electrode 290 with respect to a direction perpendicular to the plane direction. As described above, when the light blocking particles 281 are concentrated on the shortest distance between the driving lump electrode 290 and the plurality of slits 250, the light path control film 200 can allow the light emitted from the display panel 100 to be transmitted therethrough. For example, the light emitted in the front and front diagonal directions of the display panel 100 can be transmitted through the light path control film 200 without being blocked by the light blocking particles 281. That is, the light path control film 200 can concentrate the light blocking particles 281 on the overlapping region of the driving lump electrode 290 and the plurality of slits 250 to enhance an aperture ratio of the display panel 100.

Figure 15A:
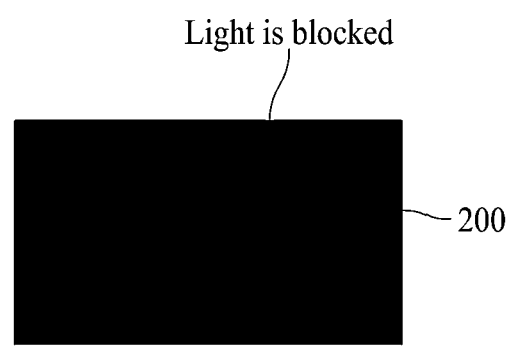
FIGS. 15A to 15C are cross-sectional views illustrating movement of light blocking particles when a driving voltage is applied to a driving electrode pattern and plan views showing light transmittance of a light path control film according to embodiments of the present disclosure.
Figure 15A:
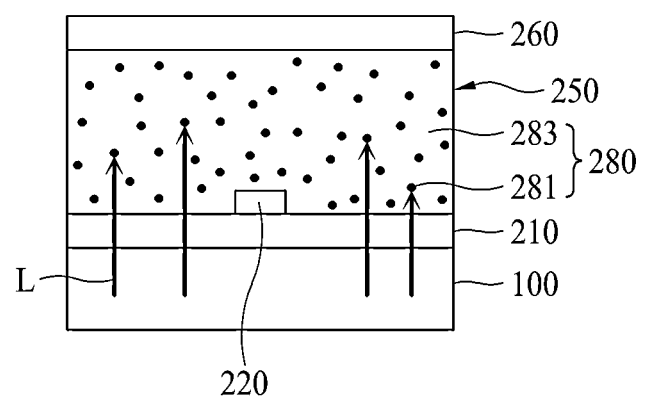
Figure 15B:
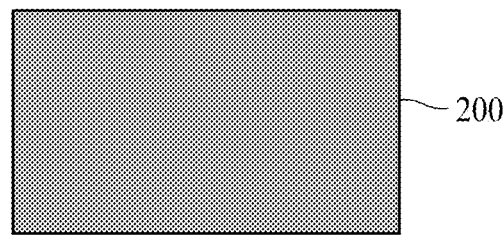
Figure 15B:
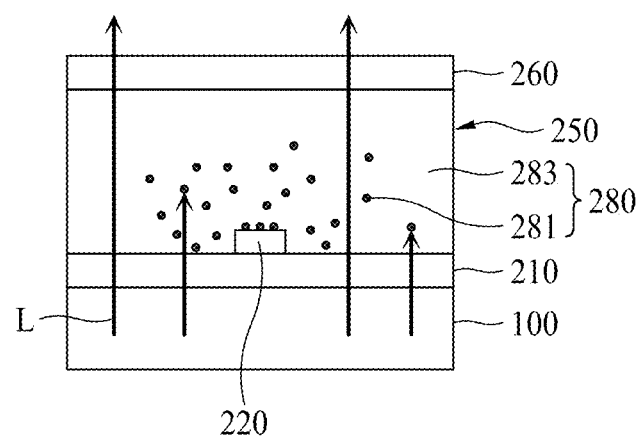
Figure 15C:
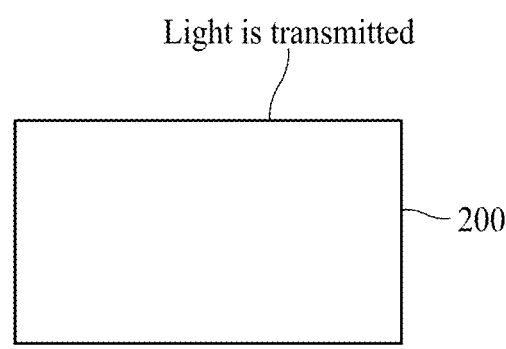
Figure 15C:
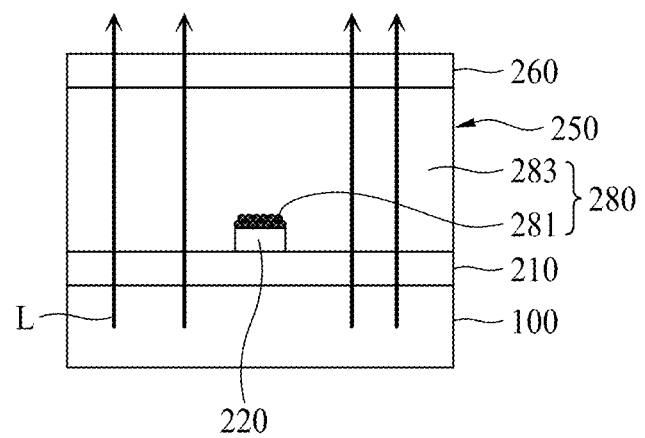

FIGS. 15A to 15C are cross-sectional views illustrating movement of light blocking particles when a driving voltage is applied to a driving electrode pattern and plan views showing light transmittance of the light path control film according to the present disclosure. Here, FIG. 15A shows a state in which the driving voltage Vd is not applied to the driving electrode pattern 220, FIG. 15B shows a state in which the light blocking particles 281 are concentrated immediately after the driving voltage Vd is applied to the driving electrode pattern 220, and FIG. 15C shows a state in which concentrating of the light blocking particles 281 after the driving voltage Vd is applied to the driving electrode pattern 220 is completed.

Referring to FIG. 15A, the light blocking particles 281 can be scattered in the entire region of the plurality of slits 250 unless the driving voltage Vd is applied to the driving electrode pattern 220. Specifically, when the light blocking particles 281 are scattered in the entire region of the plurality of slits 250, the light blocking particles 281 can block a partial amount of light L emitted from the display panel 100. For example, light L emitted to the front of the display panel 100 is not blocked by the light blocking particles 281 and light L emitted in a direction except for the front of the display panel 100 (e.g., front diagonal direction) can be blocked by the light blocking particles 281. Thus, transmittance of the light path control film 200 can be lowered. Therefore, the light path control film 200 can scatter the light blocking particles 281 in the entire region of the plurality of slits 250 to control a wide viewing angle of the display apparatus.

Referring to FIG. 15B, the light blocking particles 281 can move toward the driving electrode pattern 220 immediately after the driving voltage Vd is applied to the driving electrode pattern 220. Specifically, the light blocking particles 281 can move from the region where the driving electrode pattern 220 and the plurality of slits 250 do not overlap to the region where the driving electrode pattern 220 and the plurality of slits 250 overlap each other with respect to a plane direction. Also, the light blocking particles 281 can move toward the driving electrode pattern 220 with respect to a direction perpendicular to the plane direction.

Referring to FIG. 15C, when the light blocking particles 281 concentrate on the shortest distance between the driving electrode pattern 220 and the plurality of slits 250 as the driving voltage Vd is applied to the driving electrode pattern 220, only the transparent fluid 283 may remain in the remaining area of the plurality of slits 250. When the light blocking particles 281 concentrate on the overlap region of the driving electrode pattern 220 and the plurality of slits 250, the light path control film 200 can allow the light L emitted from the display panel 100 to be transmitted therethrough. For example, the light L emitted in the front and front diagonal directions of the display panel 100 can be transmitted through the light path control film 200 without being blocked by the light blocking particles 281. Thus, transmittance of the light path control film 200 can be increased. Therefore, the light path control film 200 can concentrate the light blocking particles 281 on the overlapping region of the driving electrode pattern 220 and the plurality of slits 250 to enhance an aperture ratio of the display panel 100.

Figure 16:
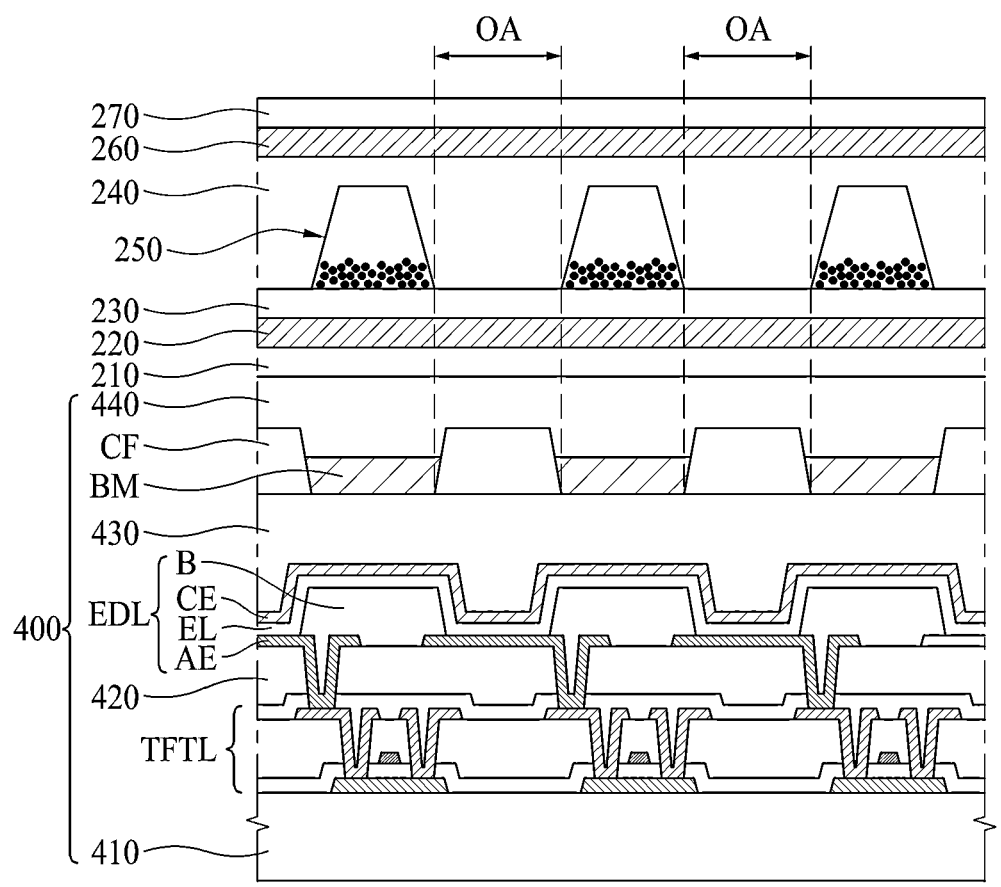
FIG. 16 is a cross-sectional view showing a display apparatus according to another embodiment of the present disclosure.

FIG. 16 is a cross-sectional view showing a display apparatus according to a fifth embodiment of the present disclosure. In the fifth embodiment shown in FIG. 16, the display panel 400 includes a light emitting element layer and the same configuration as the above-described configuration will be briefly described or omitted.

Referring to FIG. 16, the display apparatus includes a display panel 400 and a light path control film 200.

The display panel 400 includes a substrate 410, a circuit element layer TFTL, a planarization layer 420, a light emitting element layer (EDL), an encapsulant layer 430, a plurality of color filters CF, a black matrix (BM), and a buffer layer 440.

The substrate 410, as a base substrate, can be a flexible substrate. For example, the substrate 410 can include a transparent polyimide material.

The circuit element layer TFTL can be formed on the substrate 410 and include a plurality of signal lines, a plurality of thin film transistors (TFTs), and a capacitor.

The planarization layer 420 can be formed on the circuit element layer TFTL to planarize the top of the circuit element layer TFTL.

The light emitting element layer EDL can be connected to each of the plurality of transistors to form a plurality of light emitting areas OA. Specifically, the light emitting element layer EDL can include an anode electrode AE, an organic light emitting layer EL, a cathode electrode CE, and a bank B. The anode electrode AE can be patterned to correspond to each of the plurality of pixels. The bank B can be formed in a matrix structure to define a plurality of light emitting areas. The organic light emitting layer EL can be formed on the anode electrode AE and the bank B and the cathode electrode CE can be formed on the organic light emitting layer EL.

The encapsulant layer 430 is formed on the light emitting element layer EDL to prevent moisture from penetrating into the light emitting element layer EDL.

The plurality of color filters CF can be disposed on the encapsulant layer 430 and correspond to the plurality of light emitting areas OA, respectively. The black matrix BM can be disposed between each of the plurality of color filters CF. Accordingly, the black matrix BM can be arranged between each of the plurality of light emitting areas OA.

The buffer layer 440 can cover the plurality of color filters CF and the black matrix BM and can provide a flat surface on the plurality of color filters CF and the black matrix BM.

The display panel 400 can be modified into various structures known in the art.

The intersection region of the driving electrode pattern 220 and the plurality of slits 250 can overlap with the black matrix BM. Specifically, when the driving voltage Vd is applied to the driving electrode pattern 220, the light blocking particles 281 can be concentrated on an overlapping region of the driving electrode pattern 220 and the plurality of slits 250. Here, the light blocking particles 281 can be concentrated on a region where the driving electrode pattern 220 and the plurality of slits 250 overlap the black matrix BM. That is, the light blocking particles 281 can be concentrated such that the light blocking particles 281 overlap the black matrix BM of the display panel 400 while not overlapping with the plurality of light emitting areas OA. In this manner, the light path control film 200 can be coupled with the display panel 400 such that the region where the light blocking particles 281 are concentrated and the area where the plurality of light emitting areas OA of the display panel 400 overlap is minimized, and an aperture ratio of the display panel 400 can be maximized.

The display apparatus can further include a display driving circuit section for driving the display panel 400. The display driving circuit section can include a plurality of circuit films, a plurality of driving integrated circuits, a printed circuit board, and a timing controller.

Each of the plurality of circuit films can be adhered to a pad part of the display panel 400 and the printed circuit board.

Each of the plurality of driving integrated circuits can be individually mounted on the plurality of circuit films, respectively.

According to an example, one of the plurality of driving integrated circuits can provide a driving voltage Vd to the driving electrode pattern 220 while providing a data voltage to the plurality of thin film transistors. Thus, the driving electrode pattern 220 of the light path control film 200 can receive the driving voltage Vd through the driving integrated circuit of the display driving circuit section for driving the display panel 400 without requiring a separate driving integrated circuit.

The printed circuit board can support the timing controller and transmit signals and power between the components of the display driving circuit section.

The timing controller is mounted on the printed circuit board and can receive image data and a timing synchronization signal provided from the display driving system through a user connector provided on the printed circuit board. The timing controller can generate each of a data control signal and a scan control signal based on a timing synchronization signal, control a driving timing of each driving integrated circuit through the data control signal, and control a driving timing of a scan driving circuit section through a scan control signal.

Figure 17:
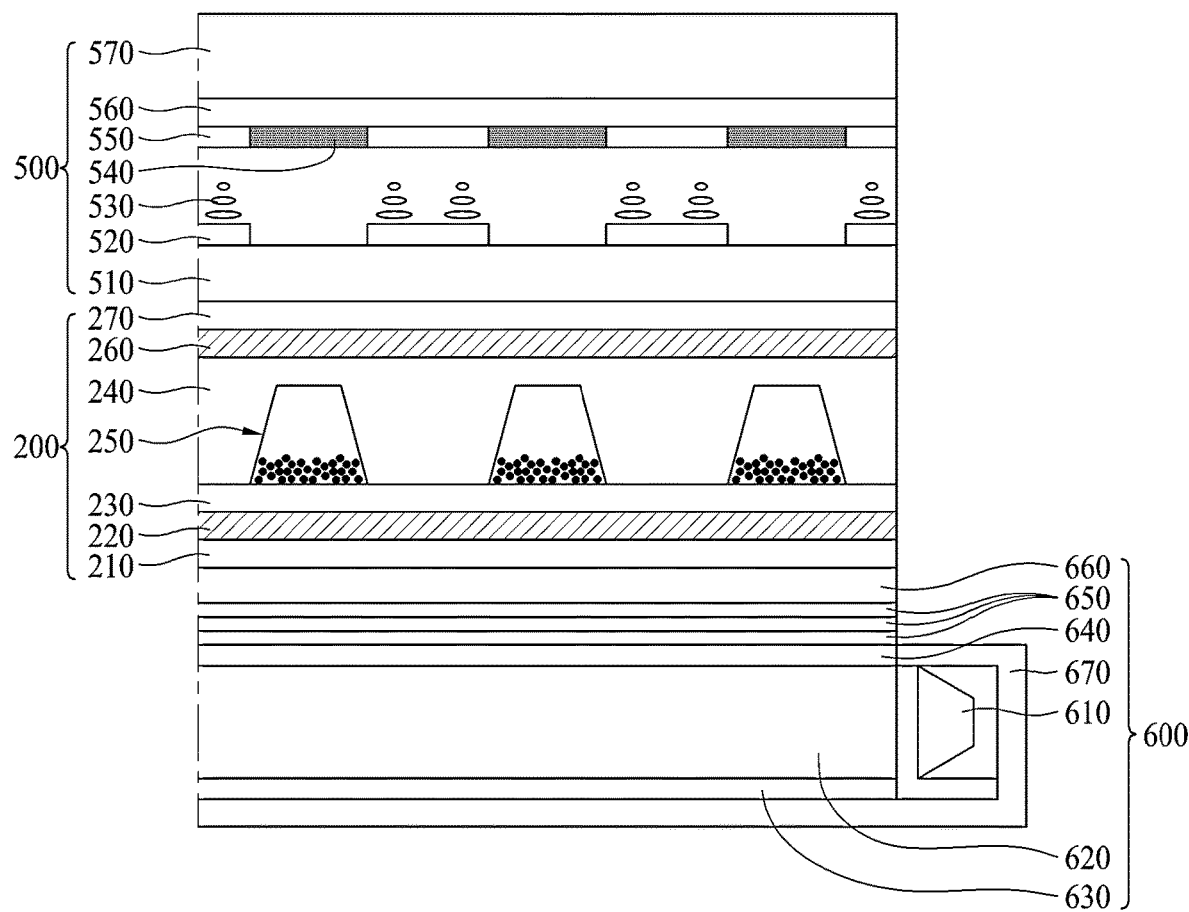
FIG. 17 is a cross-sectional view showing a display apparatus according to an embodiment of the present disclosure.

FIG. 17 is a cross-sectional view showing a display apparatus according to a sixth embodiment of the present disclosure. The sixth embodiment shown in FIG. 17 includes a display panel 500 and the backlight unit 600, and the same configuration as the above-described configuration will be briefly described or omitted.

Referring to FIG. 17, the display panel 500 includes a lower substrate 510, a first electrode 520, a liquid crystal layer 530, a black matrix 540, a plurality of color filters 550, second electrode 560, and an upper substrate 570.

The lower substrate 510, as a base substrate, can be a flexible substrate. For example, the lower substrate 510 can include a transparent polyimide material. In addition, the lower substrate 510 can include a plurality of thin film transistors that adjust light transmittance of each of the plurality of pixels.

The first electrode 520 can be connected to each of the plurality of thin film transistors that control light transmittance of each of the plurality of pixels on the lower substrate 510.

The second electrode 560 can be integrally formed on the upper substrate 570. A plurality of color filters 550 can be formed to correspond to a plurality of pixels, respectively, on the upper substrate 570 and the black matrix 540 can be disposed between each of the plurality of color filters 550 on the upper substrate 570. The upper substrate 570 having the black matrix 540 and the plurality of color filters 550 can be bonded to the lower substrate 510 having the plurality of thin film transistors and the first electrode 520, and a liquid crystal layer 530 can be injected between the lower substrate 510 and the upper substrate 570. That is, the liquid crystal layer 530 can be interposed between the lower substrate 510 and the upper substrate 570.

The liquid crystal layer 530 can be arranged according to a vertical electric field formed between the first electrode 220 and the second electrode 560 and the display panel 500 can be arranged in the arrangement of the liquid crystal layer 530 can display an image by adjusting transmittance of light irradiated by the backlight unit 600 according to arrangement of the liquid crystal layer 530.

The display apparatus can further include a display driving circuit section for driving the display panel 500. The display driving circuit section can include a plurality of circuit films, a plurality of driving integrated circuits, a printed circuit board, and a timing controller.

Each of the plurality of circuit films can be adhered to the pad part of the display panel 500 and the printed circuit board.

The plurality of driving integrated circuits can be individually mounted on the plurality of circuit films, respectively.

According to an example, one of the plurality of driving integrated circuits can provide the driving voltage Vd applied to the driving electrode pattern 220 while providing a data voltage to the plurality of thin film transistors. The light path control film 200 does not require a separate driving integrated circuit and can receive the driving voltage Vd by the driving electrode pattern 220 through the driving integrated circuit of the display driving circuit section for driving the display panel 500.

The printed circuit board supports the timing controller and can transmit signals and power between the components of the display driving circuit section.

The timing controller is mounted on the printed circuit board and can receive image data and a timing synchronization signal provided from the display driving system through the user connector provided on the printed circuit board. The timing controller can generate a data control signal and a scan control signal based on the timing synchronization signal, control a driving timing of each of the driving integrated circuits through the data control signal, and control a driving timing of the scan driving circuit through a scan control signal.

The backlight unit 600 can include a light source unit 610, a light guide plate 620, a reflective sheet 630, a first adhesive layer 640, a plurality of optical sheets 650, and a second adhesive layer 660.

The light source unit 610 can be disposed on a side surface of the light guide plate 620 and can irradiate light toward the light guide plate 620. The light source unit 610 can further include a plurality of light sources and a printed circuit board that provides a power supply voltage to the plurality of light sources and provides the driving voltage Vd to the driving electrode pattern 220. The printed circuit board can provide the power supply voltage to the plurality of light sources and provide the driving voltage Vd to the driving electrode pattern 220. Therefore, the light path control film 200 does not need a separate driving integrated circuit and can receive the driving voltage Vd by the driving electrode pattern 220 through the printed circuit board for driving the backlight unit 600.

The light guide plate 620 can emit the light provided from the light source unit 610 toward the display panel 500.

The reflective sheet 630 can be disposed on a side of the light guide plate 620 opposite to one side thereof facing the display panel 500 to prevent light from leaking to the rear surface of the display apparatus and improve luminance uniformity.

The plurality of optical sheets 650 can be disposed on one side of the light guide plate 620 through the first adhesive layer 640 to improve a luminance characteristic of light emitted from the light guide plate 620.

The backlight unit 600 can be adhered to the light path control film 200 through the second adhesive layer 660.

Therefore, the display apparatus according to the present disclosure can control a wide viewing angle by scattering the light blocking particles in the entirety of the plurality of slits and enhance an aperture ratio of the display panel and ensure visibility by concentrating the light blocking particles in specific portions of the plurality of slits. In addition, the display apparatus can ensure outdoor visibility, while reducing power consumption, by implementing the wide viewing angle by concentrating the light blocking particles in the specific portions of the plurality of slits in the first mode, and control the viewing angle by implementing a narrow viewing angle by scattering the light blocking particles in the entirety of the plurality of slits in the second mode.

Figure 18:
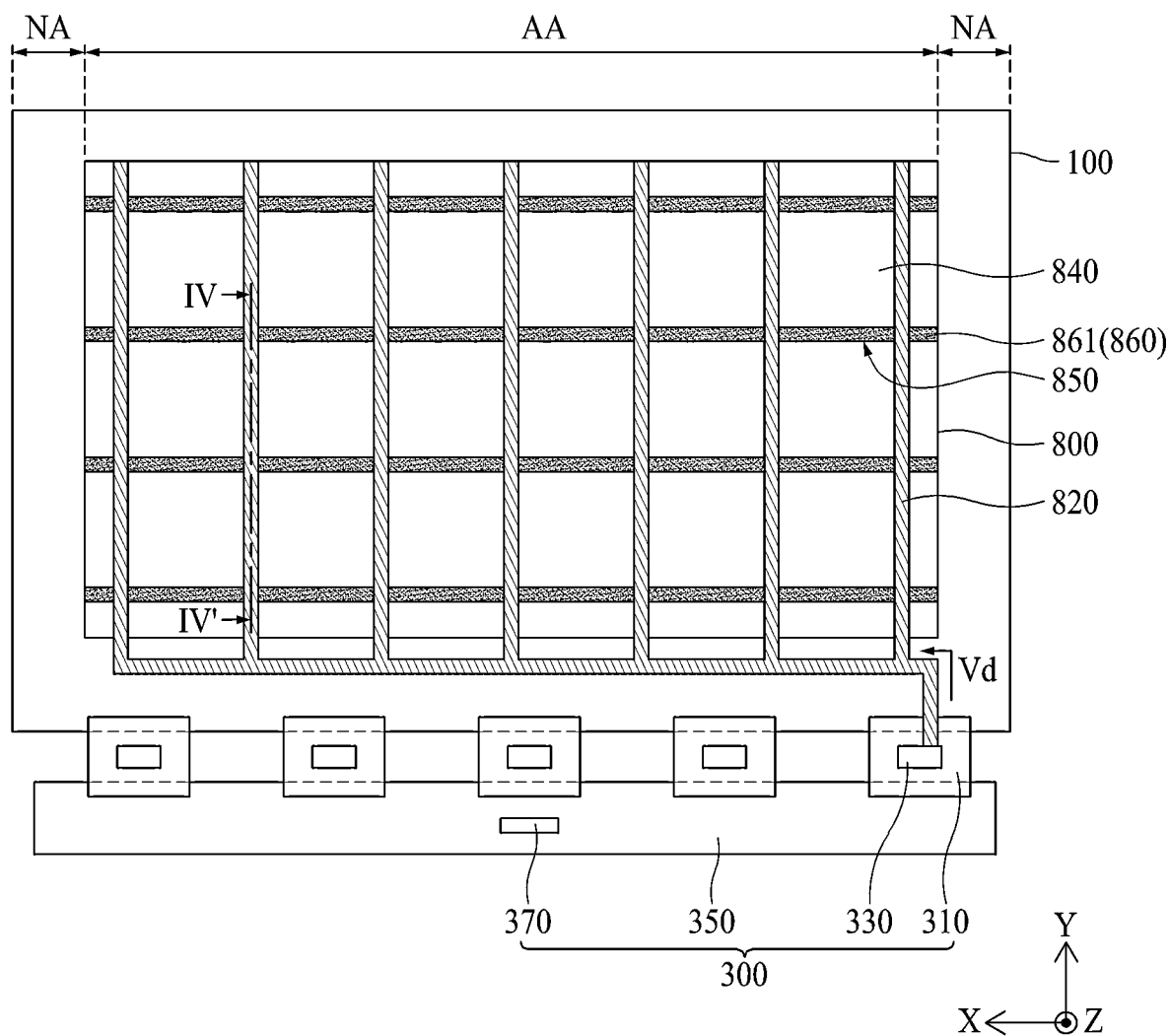
FIG. 18 is a plan view showing a display apparatus according to another embodiment of the present disclosure.
Figure 19:
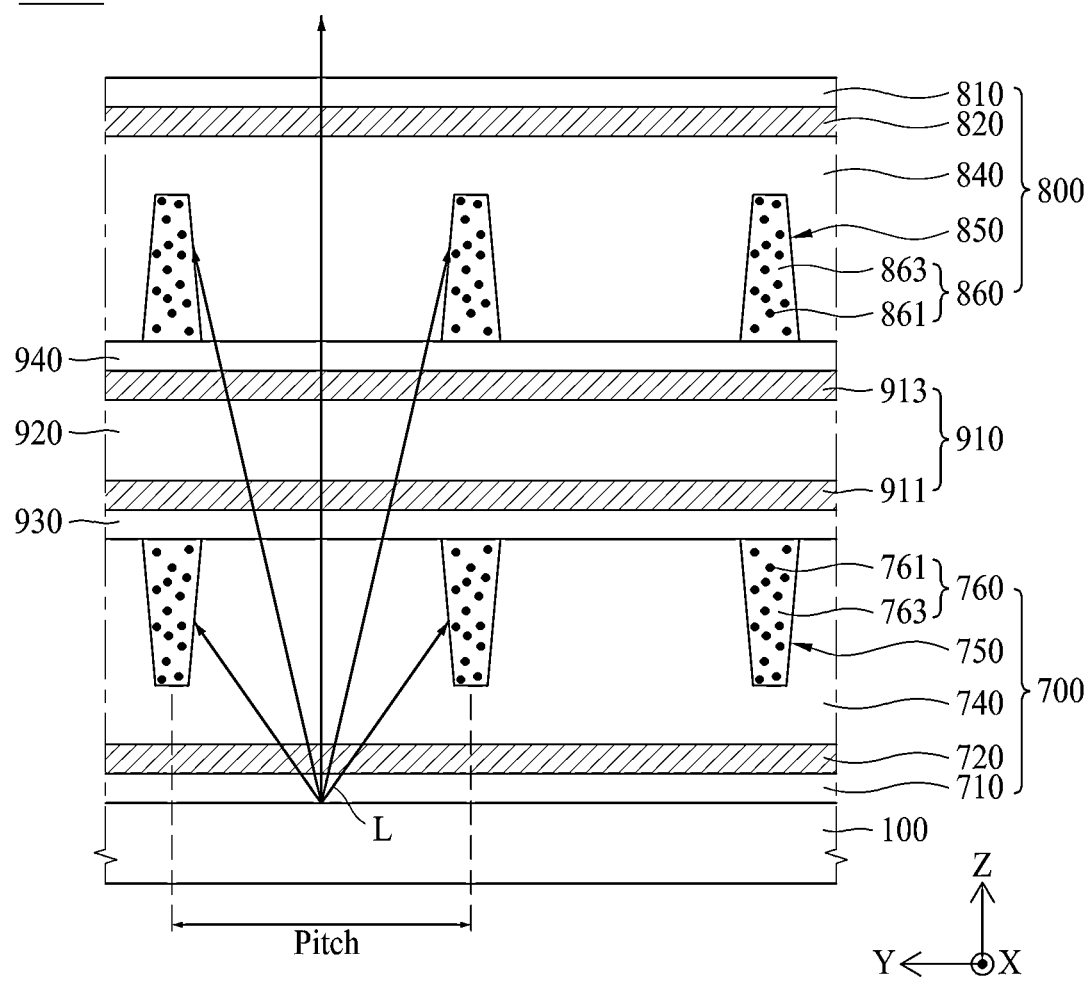
FIG. 19 is a cross-sectional view taken along line IV-IV' in the display apparatus shown in FIG. 18 according to an embodiment of the present disclosure.
Figure 20:
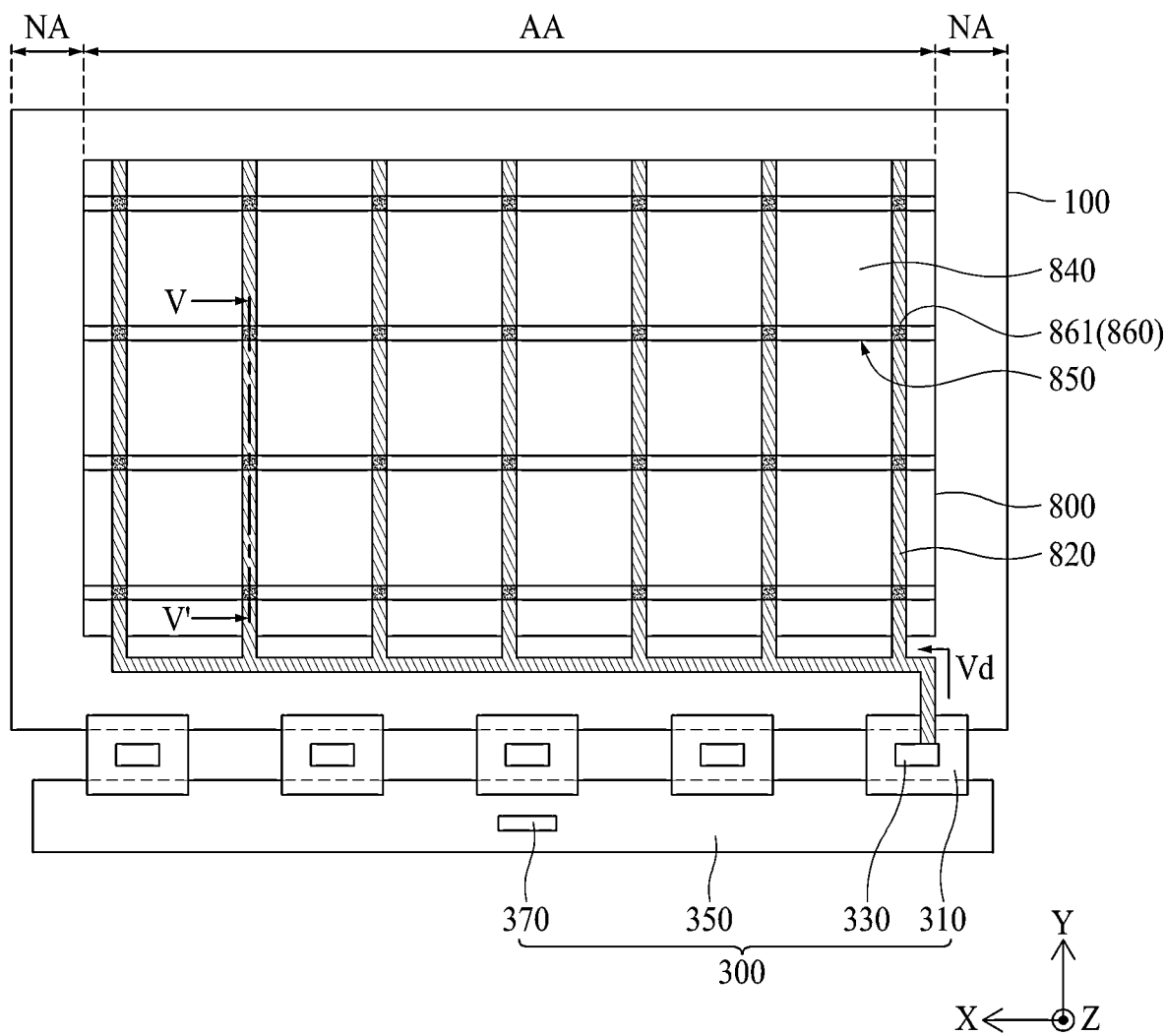
FIG. 20 is a view illustrating a state in which a driving voltage is applied to each of a lower driving electrode pattern and an upper driving electrode pattern in the display apparatus shown in FIG. 18 according to an embodiment of the present disclosure.

FIG. 18 is a plan view showing a display apparatus according to a seventh embodiment of the present disclosure, and FIG. 19 is a cross-sectional view taken along line IV-IV' in the display apparatus shown in FIG. 18. FIG. 20 is a view showing a state in which a driving voltage is applied to a lower driving electrode pattern and an upper driving electrode pattern in the display apparatus shown in FIG. 18, and FIG. 21 is a cross-sectional view taken along line V-V' shown in FIG. 20.

Figure 21:
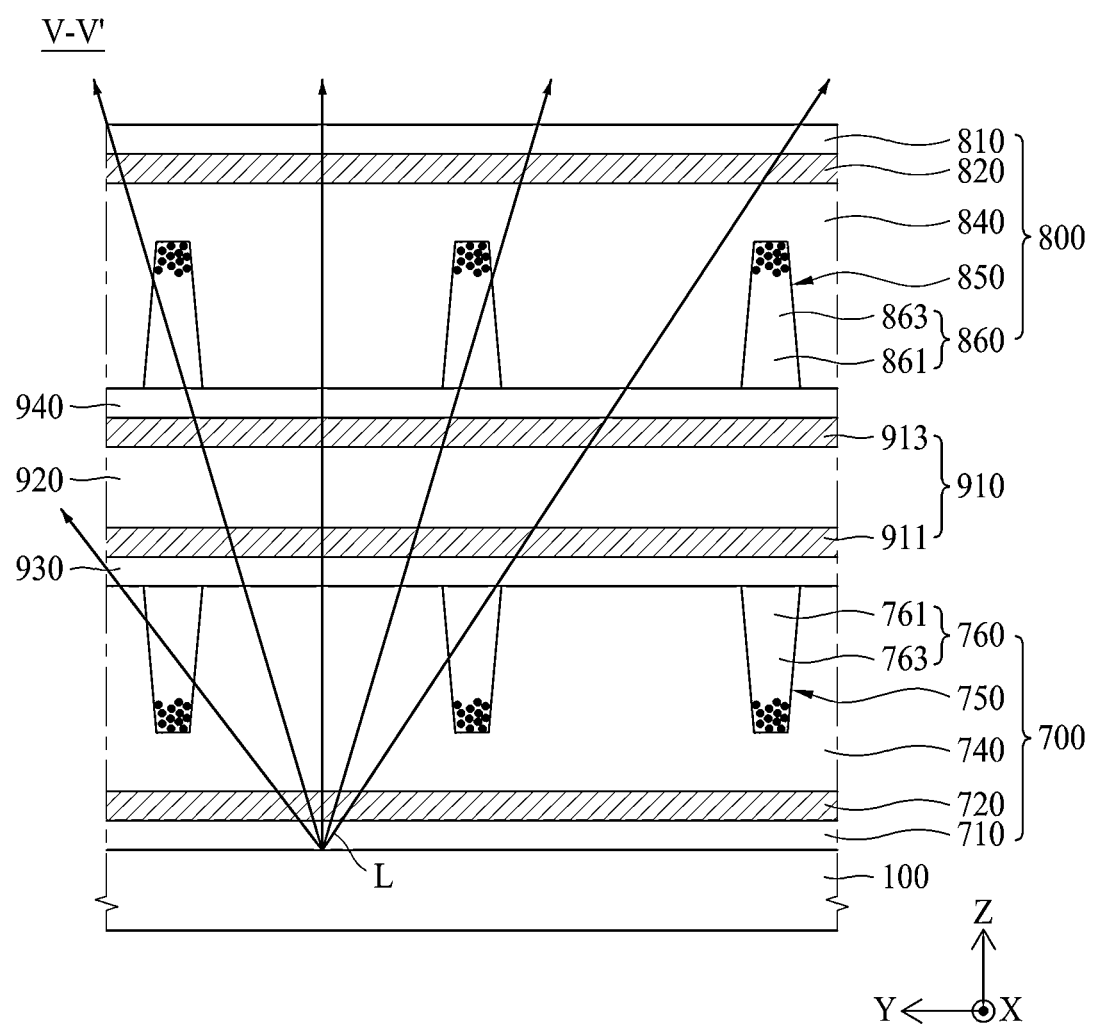
FIG. 21 is a cross-sectional view taken along line V-V' shown in FIG. 20 according to an embodiment of the present disclosure.
Figure 22:
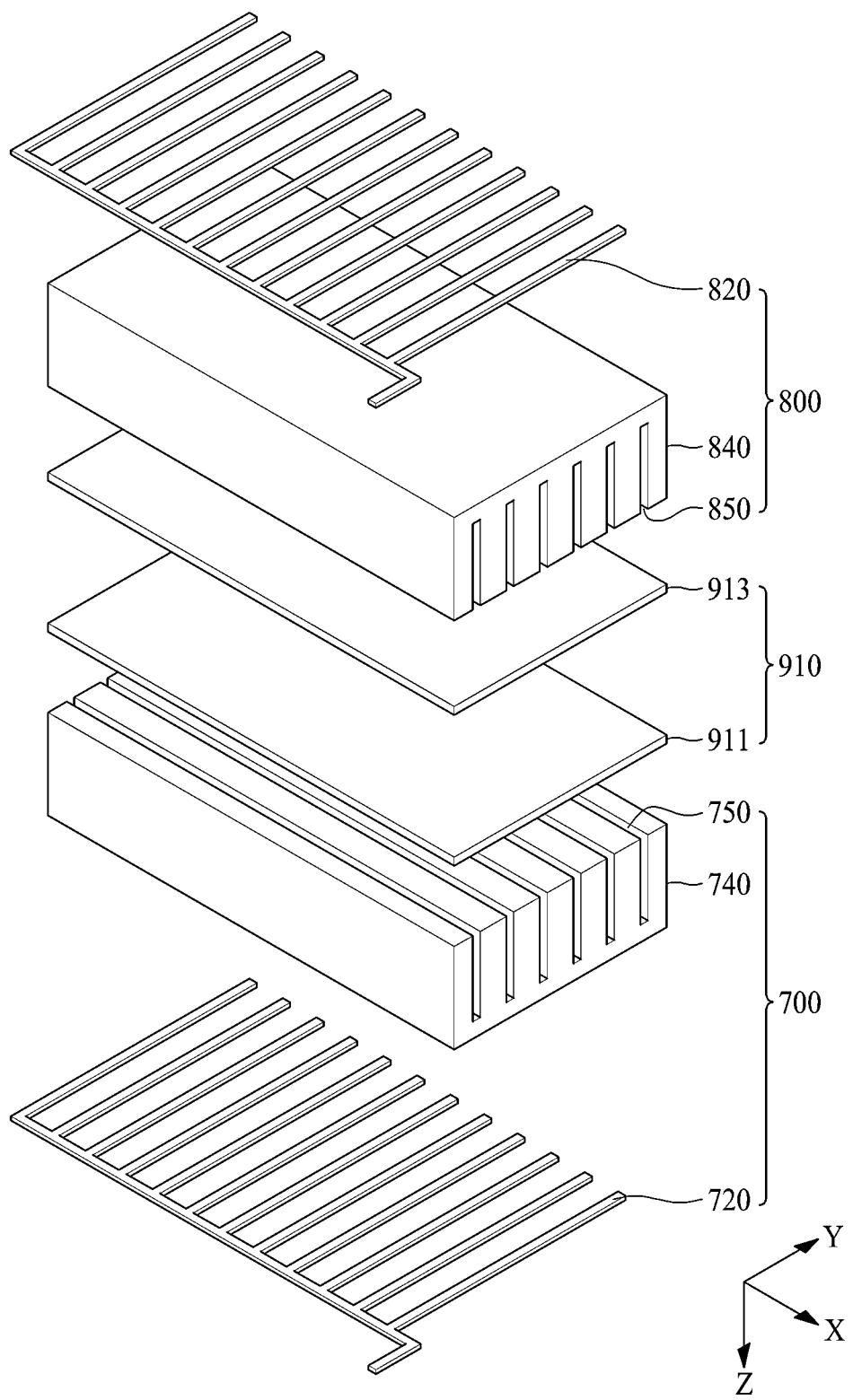
FIG. 22 is a perspective view showing first and second light path control layers shown in FIG. 19 according to an embodiment of the present disclosure.

Here, FIGS. 18 and 19 show states in which light blocking particles 761 and 861 are scattered in the entire region of each of a plurality of lower slits 750 and a plurality of upper slits 850, FIGS. 20 and 21 show states in which the light blocking particles 761 and 861 are concentrated on an overlapping region of the lower driving electrode pattern 720 and the plurality of lower slits 750 and an overlapping region of the lower driving electrode pattern 720 and the plurality of lower slits 750 and an overlapping region of an upper driving electrode pattern 820 and the plurality of upper slits 850.

Referring to FIGS. 18 to 22, the display apparatus includes the display panel 100, the display driving circuit section 300, and light path control films 700 and 800.

The display panel 100 can include a display area AA and a non-display area NA. The display area AA is an area where an image is displayed, and can correspond to a central portion of the display panel 100. The non-display area NA is an area where an image is not displayed, and can correspond to an edge portion of the display panel 100 surrounding the display area AA. For example, the display panel 100 can be any type of display panel, such as a liquid crystal display panel, an organic light emitting diode (OLED) display panel, and an electroluminescent display panel.

The display driving circuit section 300 can include a plurality of circuit films 310, a plurality of driving integrated circuits 330, a printed circuit board 350, and a timing controller 370. Here, since the display driving circuit section 300 of FIG. 18 is the same as the display driving circuit section of FIG. 1, a detailed description will be omitted.

The light path control films 700 and 800 can be disposed on the front surface or the rear surface of the display panel 100. The light path control films 700 and 800 can be disposed to overlap the display area AA of the display panel 100. According to an example, the light path control films 700 and 800 can be adhered to the display panel 100 through an adhesive member or can be provided integrally with the display panel 100.

The light path control films include a first light path control layer 700 and a second light path control layer 800.

The first light path control layer 700 includes a first base film 710, a lower driving electrode pattern 720, a plurality of first protruding patterns 740, a plurality of lower slits 750, an electrophoresis liquid 760.

The first base film 710 can support the lower driving electrode pattern 720. For example, the first base film 710 can be formed of a transparent material, and an upper surface and a lower surface thereof can have a flat structure.

The lower driving electrode pattern 720 can be patterned on the first base film 710. For example, the lower driving electrode pattern 720 can be formed of a transparent electrode such as ITO, but is not limited thereto. The lower driving electrode pattern 720 can face a common electrode 910 with a plurality of lower slits 750 interposed therebetween and the lower driving electrode pattern 720 can receive a driving voltage Vd from the display driving circuit section 300.

The lower driving electrode pattern 720 may be arranged to intersect a longitudinal direction of the plurality of lower slits 750. According to an example, the lower driving electrode pattern 720 can be disposed such that a region thereof overlapping the plurality of lower slits 750 is minimized. For example, if each of the plurality of lower slits 750 has a line shape extending in a first direction X, the lower driving electrode pattern 720 can extend in a second direction Y perpendicular to the first direction X. Here, the first direction X corresponds to a horizontal direction on the display panel 100 and the second direction Y corresponds to a vertical direction on the display panel 100, but the present disclosure is not limited thereto. In this manner, the arrangement structure of the lower driving electrode patterns 720 is changed according to the arrangement structure of the plurality of lower slits 750, whereby the region in which the lower driving electrode patterns 720 overlap the plurality of lower slits 750 can be minimized.

The plurality of first protruding patterns 740 can be adhered on one surface of a first common electrode 911 through a third adhesive layer 930. Specifically, the plurality of first protruding patterns 740 can be formed on the first base film 710 and the lower driving electrode pattern 720 and then adhered to the first common electrode 911 formed on the third base film 920. When the plurality of first protruding patterns 740 are adhered to the first common electrode 911 through the third adhesive layer 930, the plurality of lower slits 750 surrounded by the plurality of first protruding patterns 740 and the third adhesive layer 930 can be formed. Therefore, each of the plurality of lower slits 750 can correspond to a concave portion provided between each of the plurality of first protruding patterns 740 adjacent to each other.

According to an example, the plurality of first protruding patterns 740 can be formed by applying a predetermined material layer on the first base film 710 and the lower driving electrode pattern 720 and then pressing the predetermined material layer using a stamper. Here, the predetermined material layer can correspond to a UV resin or a photoresist. That is, the stamper can form the plurality of first protruding patterns 740 and the plurality of lower slits 750 corresponding to the plurality of first protruding patterns 740. In addition, the stamper can determine a shape of the plurality of lower slits 750 corresponding to the plurality of first protruding patterns 740.

The plurality of lower slits 750 are surrounded by the plurality of first protruding patterns 740 and the third adhesive layer 930 and each of the plurality of lower slits 750 can correspond to a concave portion provided between each of the plurality of first protruding patterns 740 adjacent to each other. As described above, each of the plurality of lower slits 750 can have a line shape extending in the first direction X but it is not limited thereto and can be arranged in various forms.

The electrophoresis liquid 760 can be prepared by mixing light blocking particles 761 and a transparent fluid 763. When the first base film 710 and the third base film 920 are adhered together to form the plurality of lower slits 750 surrounded by the plurality of first protruding patterns 740 and the third adhesive layer 930, the electrophoresis liquid 760 can be injected into the plurality of lower slits 750.

The light blocking particles 761 can include an electrophoretic material moving in a direction toward the lower driving electrode pattern 720 when the driving voltage Vd is applied to the lower driving electrode pattern 720. That is, the light blocking particles 761 can have a light blocking (or light absorption) characteristic, while having an electrophoresis characteristic. According to an example, the light blocking particles 761 can block (or absorb) a partial amount of light L emitted from the display panel 100. For example, the light blocking particles 761 can be formed of carbon black having a high light absorbance and a high electrical conductivity, but the present disclosure is not limited thereto. The transparent fluid 763 can allow light to be transmitted therethrough, flow in the plurality of lower slits 750, and support movement of the light blocking particles 761.

The second light path control layer 800 includes a second base film 810, an upper driving electrode pattern 820, a plurality of second protruding patterns 840, a plurality of upper slits 850, an electrophoresis liquid 860.

The second base film 810 can support the upper driving electrode pattern 820. For example, the second base film 810 can be formed of a transparent material, and an upper surface and a lower surface thereof can have a flat structure.

The upper driving electrode pattern 820 can be patterned on the second base film 810. For example, the upper driving electrode pattern 820 can be formed of a transparent electrode such as ITO, but is not limited thereto. The upper driving electrode pattern 820 can face the common electrode 910 with a plurality of upper slits 850 interposed therebetween and the upper driving electrode pattern 820 can receive a driving voltage Vd from the display driving circuit section 300. According to an example, the upper driving electrode pattern 820 can be independently driven from the lower driving electrode pattern 720.

The upper driving electrode pattern 820 can be arranged to intersect a longitudinal direction of the plurality of upper slits 850. According to an example, the upper driving electrode pattern 820 can be disposed such that a region thereof overlapping the plurality of upper slits 850 is minimized. Also, the upper driving electrode pattern 820 can be disposed to overlap the lower driving electrode pattern 720 on the display panel 100. For example, if each of the plurality of upper slits 850 has a line shape extending in a first direction X, the upper driving electrode pattern 820 can extend in a second direction Y perpendicular to the first direction X. In this manner, the arrangement structure of the upper driving electrode patterns 820 is changed according to the arrangement structure of the plurality of upper slits 850, whereby the region in which the upper driving electrode patterns 820 overlap the plurality of upper slits 850 can be minimized.

The plurality of second protruding patterns 840 can be adhered on one surface of a second common electrode 913 through a fourth adhesive layer 940. Specifically, the plurality of second protruding patterns 840 can be formed on the second base film 810 and the upper driving electrode pattern 820 and then adhered to the second common electrode 913 formed on the third base film 920. When the plurality of second protruding patterns 840 are adhered to the second common electrode 913 through the fourth adhesive layer 940, the plurality of upper slits 850 surrounded by the plurality of second protruding patterns 840 and the fourth adhesive layer 940 can be formed. Therefore, each of the plurality of upper slits 850 can correspond to a concave portion provided between each of the plurality of second protruding patterns 840 adjacent to each other.

According to an example, the plurality of second protruding patterns 840 can be formed by applying a predetermined material layer on the second base film 810 and the upper driving electrode pattern 820 and then pressing the predetermined material layer using a stamper. Here, the predetermined material layer can correspond to a UV resin or a photoresist. That is, the stamper can form the plurality of second protruding patterns 840 and the plurality of upper slits 850 corresponding to the plurality of second protruding patterns 840. In addition, the stamper can determine a shape of the plurality of upper slits 850 corresponding to the plurality of second protruding patterns 840.

The plurality of upper slits 850 are surrounded by the plurality of second protruding patterns 840 and the fourth adhesive layer 940 and each of the plurality of upper slits 850 can correspond to a concave portion provided between each of the plurality of second protruding patterns 840 adjacent to each other. As described above, each of the plurality of upper slits 850 can have a line shape extending in the first direction X but it is not limited thereto and can be arranged in various forms.

The electrophoresis liquid 860 can be prepared by mixing light blocking particles 861 and a transparent fluid 863. When the second base film 810 and the third base film 920 are adhered together to form the plurality of upper slits 850 surrounded by the plurality of second protruding patterns 840 and the fourth adhesive layer 940, the electrophoresis liquid 860 can be injected into the plurality of upper slits 850.

The light blocking particles 861 can include an electrophoretic material moving in a direction toward the upper driving electrode pattern 820 when the driving voltage Vd is applied to the upper driving electrode pattern 820. That is, the light blocking particles 861 can have a light blocking (or light absorption) characteristic, while having an electrophoresis characteristic. According to an example, the light blocking particles 861 can block (or absorb) a partial amount of light L emitted from the display panel 100. For example, the light blocking particles 861 can be formed of carbon black having a high light absorbance and a high electrical conductivity, but the present disclosure is not limited thereto. The transparent fluid 863 can allow light to be transmitted therethrough, flow in the plurality of upper slits 850, and support movement of the light blocking particles 861.

According to an example, the plurality of lower slits 750 and the plurality of upper slits 850 are arranged to overlap each other on the display panel 100, and thus, light efficiency of the first and second light path control layers 700 and 800 can be improved. For example, the light efficiency can correspond to a ratio at which light emitted from the display panel 100 passes through the first and second light path control layers 700 and 800. Here, the respective electrophoresis liquids 760 and 860 of the first and second light path control layers 700 and 800 can absorb a partial amount of the light emitted from the display panel 100. When the driving voltage Vd is not applied to the lower driving electrode pattern 720 and the upper driving electrode pattern 820, the light blocking particles 761 and 861 can be scattered in the plurality of lower slits 750 and the plurality of upper slits 850. That is, the light blocking particles 761 and 861 are scattered in the plurality of lower slits 750 and the plurality of upper slits 850 to absorb a partial amount of the light emitted from the display panel 100. If the plurality of lower slits 750 and the plurality of upper slits 850 do not overlap each other on the display panel 100, the region where the light blocking particles 761 and 861 overlap the display panel 100 increases, and thus, the aperture ratio of the first and second light path control layers 700 and 800 can be reduced.

Therefore, the region where the light blocking particles 761 and 861 overlap the display panel 100 is smaller when the light emitted from the display panel 100 passes through the first and second light path control layers 700 and 800, the aperture ratio of the first and second light path control layers 700 and 800 increases and the light efficiency can be improved. As a result, since the plurality of lower slits 750 and the plurality of upper slits 850 are arranged to overlap each other on the display panel 100, the region where the light block particles 761 and 861 overlap the display panel 100 is minimized in a state in which the driving voltage Vd is not applied to each of the lower driving electrode pattern 720 and the upper driving electrode pattern 820, whereby the aperture ratio and light efficiency of the first and second light path control layers 700 and 800 can be increased.

The intersection region of the lower driving electrode pattern 720 and the plurality of lower slits 750 and the intersection region of the upper driving electrode pattern 820 and the plurality of upper slits 850 overlap each other on the display panel 100, whereby light efficiency of the first and second light path control layers 700 and 800 can be enhanced. For example, when the driving voltage Vd is applied to the lower driving electrode pattern 720, the light blocking particles 761 can be concentrated on the intersection region of the lower driving electrode pattern 720 and the plurality of lower slits 750. That is, the light blocking particles 761 and 861 can be concentrated on the intersection region of the lower driving electrode pattern 720 and the plurality of lower slits 750 and the intersection region of the upper driving electrode pattern 820 and the plurality of upper slits 850 to absorb a partial amount of light exiting from the display panel 100. Also, if intersection region of the lower driving electrode pattern 720 and the plurality of lower slits 750 and the intersection region of the upper driving electrode pattern 820 and the plurality of upper slits 850 do not overlap each other on the display panel 100, the region where the optical blocking particles 761 and 861 overlap the display panel 100 can increase to reduce the aperture ratio of the first and second light path control layers 700 and 800.

Therefore, since the intersection region of the lower driving electrode pattern 720 and the plurality of lower slits 750 and the intersection region of the upper driving electrode pattern 820 and the plurality of upper slits 850 are formed on the display panel 100, region where the light blocking particles 761 and 861 overlap the display panel 100 is minimized in a state where the driving voltage Vd is applied to the lower driving electrode pattern 720 and the upper driving electrode pattern 820, thus increasing the aperture ratio and light efficiency of the first and second light path control layers 700 and 800.

The common electrode 910 can be disposed between the plurality of first protruding patterns 740 and the plurality of second protruding patterns 840. The common electrode 910 can be disposed between the plurality of lower slits 750 and the plurality of upper slits 850. Specifically, the common electrode 910 can face the lower driving electrode pattern 720 with the plurality of lower slits 750 interposed therebetween, and the common electrode 910 can face the lower driving electrode pattern 720 with the plurality of upper slits 850 interposed therebetween.

According to an example, the common electrode 910 can include a first common electrode 911 disposed on one surface of the third base film 920 and a second common electrode 913 disposed on the other surface of the third base film 920. The first and second common electrodes 911 and 913 can be formed of transparent electrodes such as ITO but are not limited thereto. The first and second common electrodes 911 and 913 can each be formed as one electrode covering the entire surface of the third base film 920 or can correspond to the lower driving electrode pattern 720 and the upper driving electrode pattern 820, respectively. The first common electrode 911 can face the lower driving electrode pattern 720 with the plurality of first protruding patterns 740 and the plurality of lower slits 750 interposed therebetween and the second common electrode 913 can face the upper driving electrode pattern 820 with the plurality of second protruding patterns 840 and the plurality of upper slits 850 interposed therebetween. For example, the first and second common electrodes 911 and 913 can receive a low potential voltage lower than the driving voltage Vd or can be grounded.

The third base film 920 can be disposed between the first and second light path control layers 700 and 800 to support each of the first and second light path control layers 700 and 800. One surface of the third base film 920 can support the first common electrode 911 before being bonded to the first base film 710 and the other surface of the third base film 920 can support the second common electrode 913 before being bonded to the second base film 810. For example, the third base film 920 can be formed of a transparent material, and an upper surface and a lower surface thereof can have a flat structure.

As shown in FIGS. 18 and 19, the light blocking particles 761 can be scattered in the entire region of the plurality of lower slits 750 unless the driving voltage Vd is applied to the lower driving electrode pattern 720, and the light blocking particles 861 can be scattered in the entire region of the plurality of upper slits 850 unless the driving voltage Vd is applied to the upper driving electrode pattern 820. Specifically, when the light blocking particles 761 and 861 are scattered in the entire regions of the plurality of lower slits 750 and the plurality of upper slits 850, the light blocking particles 761 and 861 can block a partial amount of the light L emitted from the display panel 100. That is, the light blocking particles 761 and 861 scattered in the entire regions of the plurality of lower slits 750 and the plurality of upper slits 850 can serve as light blocking walls. For example, the light L emitted to the front of the display panel 100 is not blocked by the light blocking particles 761 but can be blocked by the light blocking particles 761 and 861 emitted in a direction (e.g., a front diagonal direction) excluding the front side of the display panel 100. That is, the first light path control layer 700 scatters the light blocking particles 761 in the entire region of the plurality of lower slits 750 and the second light path control layer 800 can scatter the light blocking particles 861 in the entire region of the plurality of upper slits 850, thereby controlling the wide viewing angle of the display apparatus. According to an example, the first light path control layer 700 can scatter light blocking particles 761 in the entire region of a plurality of lower slits 750 extending in the first direction X, and the second light path control layer 800 can scatter the light blocking particles 861 in the entire region of the plurality of upper slits 850 extending in the first direction X, thereby controlling a side viewing angle with respect to the vertical direction of the display apparatus.

According to an example, the display apparatus includes the first and second light path control layers 700 and 800, thereby having higher light efficiency or higher shielding characteristic than a display apparatus including one light path control layer. Specifically, since the display apparatus according to the present disclosure includes the plurality of lower slits 750 and the plurality of upper slits 850 that overlap each other, the display apparatus can have higher light efficiency than the display apparatus including one light path control layer, while having the same level of shielding characteristic as that of the display apparatus including one light path control layer. Here, the light efficiency can correspond to a rate at which light emitted from the display panel 100 passes through the light path control film. Although the pitch of the plurality of lower slits 750 and the plurality of upper slits 850 is larger than the pitch of the plurality of slits of one light path control layer, the plurality of lower slits 750 and the plurality of upper slits 850 are higher than the height of the plurality of slits of one light path control layer, and thus, the same level of shielding characteristic can be obtained. Here, the pitch of the plurality of slits corresponds to a distance between the centers of two adjacent slits. For example, in order for the display apparatus including one light path control layer to have the same level of shielding characteristic as the display apparatus according to the present disclosure, it can have a plurality of slits having a pitch smaller than or equal to the pitch of the plurality of lower slits 750 or the plurality of upper slits 850. Also, if the pitch of the plurality of slits is reduced, the overlapping areas of the plurality of slits and the display panel can be increased to reduce the light efficiency of the display apparatus. Therefore, the display apparatus according to the present disclosure can have higher light efficiency than the display apparatus including one light path control layer having the same level of shielding characteristic.

Also, since the display apparatus according to the present disclosure includes the plurality of lower slits 750 and the plurality of upper slits 850, light not blocked by the plurality of lower slits 750 can be blocked by the plurality of upper slits 850, and thus, the display apparatus according to the present disclosure can have a shielding property higher than that of the display apparatus including one light path control layer. Therefore, the display apparatus according to the present disclosure can have a shielding characteristic higher than the display apparatus including one light path control layer having the same level of light efficiency.

As shown in FIGS. 20 and 21, when the driving voltage Vd is applied to the lower driving electrode pattern 720, the light blocking particles 761 are concentrated on the overlapping regions (or intersection regions) of the lower driving electrode pattern 720 and the plurality of lower slits 750.

When the driving voltage Vd is applied to the upper driving electrode pattern 820, the light blocking particles 861 can concentrate on the overlapping regions (or intersection regions) of the upper driving electrode pattern 820 and the plurality of upper slits 850. For example, regions where the light blocking particles 761 and 861 are concentrated can be spaced apart from each other in the first direction X and the second direction Y on the display panel 100, respectively. The transparent fluids 763 and 863 may remain in a region of the plurality of lower slits 750 not perpendicular to the lower driving electrode pattern 720 and a region of the plurality of upper slits 850 not perpendicular to the upper driving electrode pattern 820. Therefore, the regions where the light blocking particles 761 and 861 are concentrated are spaced apart from each other on the display panel 100 in the first direction X and the second direction Y, respectively, thereby maximizing the aperture ratio of the display apparatus to enhance light efficiency.

According to an example, the lower driving electrode pattern 720 can receive the driving voltage Vd from the driving integrated circuit 330 and the light blocking particles 761 can be concentrated on the shortest distance between the lower driving electrode pattern 720 and the plurality of lower slits 750. The upper driving electrode pattern 820 can receive the driving voltage Vd from the driving integrated circuit 330 and the light blocking particles 861 can be concentrated on the shortest distance between the upper driving electrode pattern 820 and the plurality of upper slits 850. When the driving voltage Vd is applied to each of the lower driving electrode pattern 720 and the upper driving electrode pattern 820, the light blocking particles 761 in the plurality of lower slits 750 and the light blocking particles 861 in the plurality of upper slits 850 can move in mutually opposite directions. Also, when the driving voltage Vd is applied to the lower driving electrode pattern 720, the light blocking particles 761 in the plurality of lower slits 750 move in a direction away from the second light path control layer 800, and when the driving voltage Vd is applied to the upper driving electrode pattern 820, the light blocking particles 861 in the plurality of upper slits 850 can move in a direction away from the first light path control layer 700. That is, the light blocking particles 761 can move to a region where the lower driving electrode pattern 720 and the plurality of lower slits 750 overlap on the display panel 100. In addition, the light blocking particles 861 can move to a region where the upper driving electrode pattern 820 and the plurality of upper slits 850 overlap on the display panel 100.

When the driving voltage Vd is applied to the lower driving electrode pattern 720 or the upper driving electrode pattern 820, the light blocking particles 761 and 861 can move in a direction toward the lower driving electrode pattern 720 or the upper driving electrode pattern 820 based on the third direction Z perpendicular to the first direction X and the second direction Y. That is, the light blocking particles 761 and 861 can move toward the lower driving electrode pattern 720 or the upper driving electrode pattern 820 with respect to a thickness direction Z of the first and second light path control layers 700 and 800. Also, when the light blocking particles 761 and 861 are concentrated at the shortest distance between the lower driving electrode pattern 720 and the plurality of lower slits 750 and at the shortest distance between the upper driving electrode pattern 820 and the plurality of upper slits 850, only the transparent fluids 763 and 863 may remain in the other remaining regions of the plurality of lower slits 750 and the plurality of upper slits 850. Specifically, the transparent fluid 763 and 863 can be disposed at regions where the lower driving electrode pattern 720 and the plurality of lower slits 750 do not overlap and regions where the upper driving electrode pattern 820 and the plurality of upper slits 850 do not overlap, and can be disposed in portions of the overlapping regions of the lower driving electrode pattern 720 and the plurality of lower slits 750 and the overlapping regions of the upper driving electrode pattern 820 and the plurality of upper slits 850, excluding the portions where the light blocking particles 761 and 861 are concentrated.

When the light blocking particles 761 are concentrated on the portion adjacent to the lower driving electrode pattern 720 in the overlapping regions of the lower driving electrode pattern 720 and the plurality of lower slits 750, the first light path control layer 700 can allow the light L emitted from the display panel 100 to be transmitted therethrough.

Also, when the light blocking particles 861 are concentrated on a portion adjacent to the upper driving electrode pattern 820 in the overlapping regions of the upper driving electrode pattern 820 and the plurality of upper slits 850, the second light path control layer 800 can allow light transmitted through the first light path control layer 700 to be transmitted therethrough. For example, the light L emitted in the front and front diagonal directions of the display panel 100 may not be blocked by the light blocking particles 761 and 861 and can be transmitted through the first and second light path control layers 700 and 800 to enhance the aperture ratio of the display panel 100.

Therefore, the first and second light path control layers 700 and 800 can determine whether to concentrate the light blocking particles 761 and 861 depending on whether the driving voltage Vd is applied, thereby selectively controlling the wide viewing angle or enhancing the aperture ratio of the display panel. As a result, the first and second light path control layers 700 and 800 determine whether to concentrate the light blocking particles 761 and 861, thereby ensuring outdoor visibility and reducing power consumption to lengthen the life of the display apparatus.

According to an example, the first and second light path control layers 700 and 800 can concentrate the light blocking particles 761 and 861 at the shortest distance between the lower driving electrode pattern 720 and the plurality of lower slits 750 or at the shortest distance between the upper driving electrode pattern 820 and the plurality of upper slits 850 in the first mode to allow the light emitted from the display panel 100 to be transmitted therethrough.

In the second mode, the first and second light path control layers 700 and 800 can scatter the light blocking particles 761 and 861 in the entire region of the plurality of lower slits 750 and the plurality of upper slits 850 to block a partial amount of the light emitted from the display panel 100. Here, the first and second light path control layers 700 and 800 can control the wide viewing angle through the second mode, and the aperture ratio of the display panel 100 can be improved through the first mode than when compared to the second mode. For example, the first mode can correspond to the wide viewing angle mode or a daytime mode and the second mode can correspond to a narrow viewing angle mode or a nighttime mode, but is not limited thereto. As described above, the first and second light path control layers 700 and 800 can implement high brightness without increasing power consumption for driving the display panel 100 by improving the aperture ratio of the display panel 100 in the first mode. By controlling the wide viewing angle in the second mode, the first and second light path control layers 700 and 800 can prevent an image of the display panel 100 from being reflected on another place (for example, a glass disposed near the display panel 100). As a result, the first and second light path control layers 700 and 800 can improve the aperture ratio of the display panel or control the wide viewing angle by selecting one of the first mode and the second mode.

Figure 23:
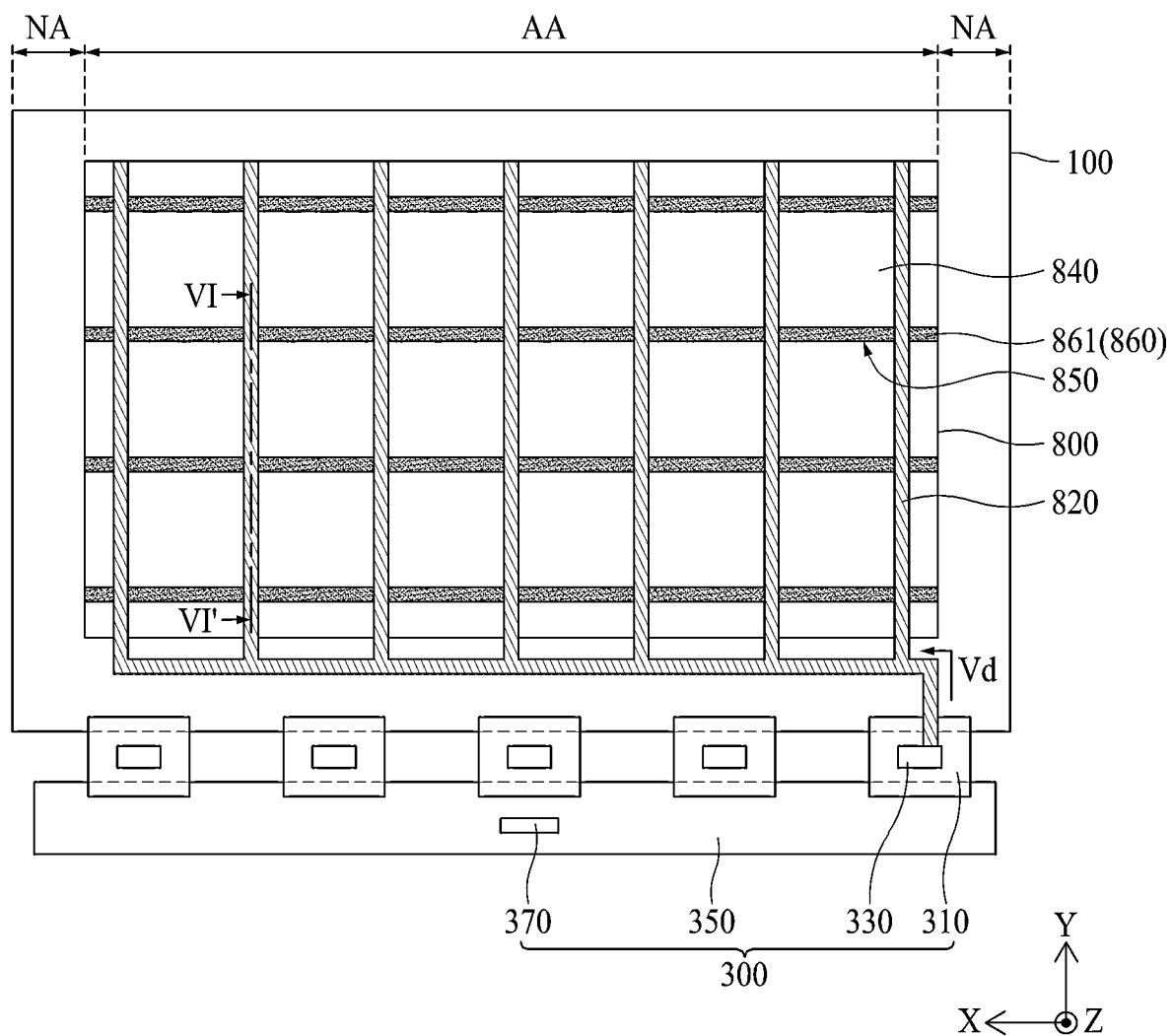
FIG. 23 is a plan view showing a display apparatus according to another embodiment of the present disclosure.
Figure 24:
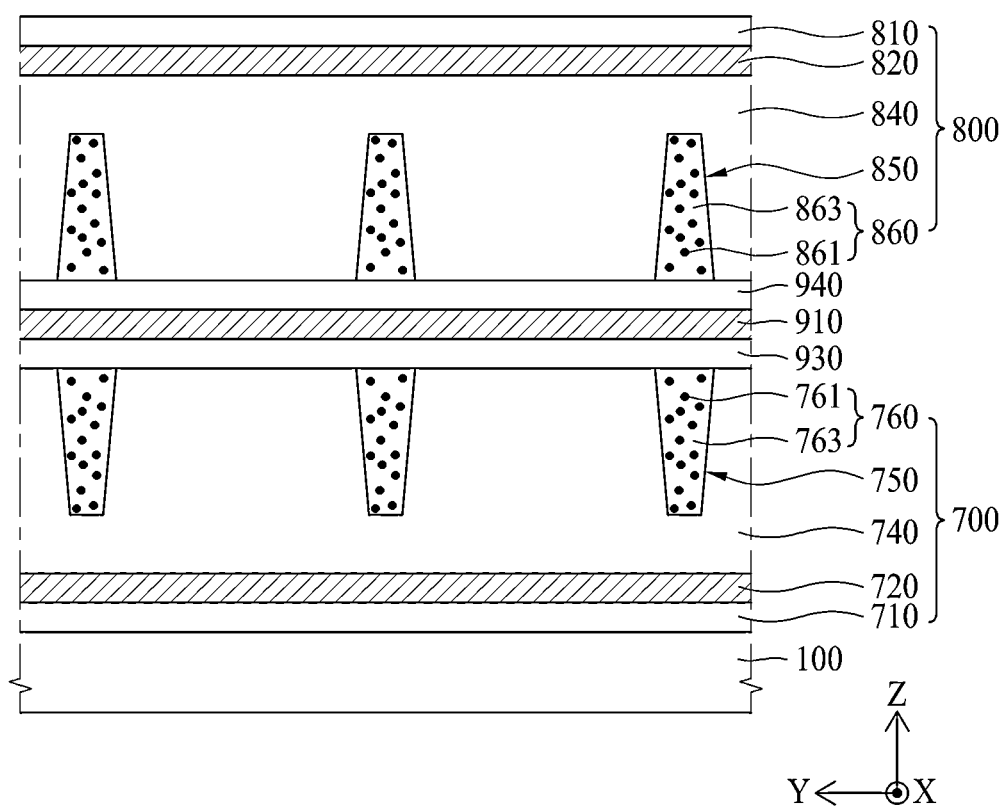
FIG. 24 is a cross-sectional view taken along line VI-VI' in the display apparatus shown in FIG. 23 according to an embodiment of the present disclosure.

FIG. 23 is a plan view showing a display apparatus according to an eighth embodiment of the present disclosure, and FIG. 24 is a cross-sectional view taken along line VI-VI' in the display apparatus shown in FIG. 23. Here, the light path control film of FIGS. 23 and 24 does not include the third base film 920 and has a configuration different from the light path control film of FIGS. 18 to 22, and the same configuration as the configuration described above will be briefly described or omitted.

Referring to FIGS. 23 and 24, the first light path control layer 700 can include a first base film 710, a lower driving electrode pattern 720, a plurality of first protruding patterns 740, a plurality of lower slits 750, and an electrophoresis liquid 760.

The first base film 710 can support the lower driving electrode pattern 720.

The lower driving electrode pattern 720 can be patterned on the first base film 710. Also, the lower driving electrode pattern 720 can face the common electrode 910 with a plurality of lower slits 750 interposed therebetween and the lower driving electrode pattern 720 can receive a driving voltage Vd from the display driving circuit section 300.

The plurality of first protruding patterns 740 can be adhered on one surface of the common electrode 910 through the third adhesive layer 930. Specifically, the plurality of first protruding patterns 740 can be formed on the first base film 710 and the lower driving electrode pattern 720 and then adhered to one surface of the common electrode 910 by the medium of the third adhesive layer 930. When the plurality of first protruding patterns 740 are adhered to the common electrode 910, the plurality of lower slits 750 surrounded by the plurality of first protruding patterns 740 and the third adhesive layer 930 can be formed. Therefore, each of the plurality of lower slits 750 can correspond to a concave portion provided between each of the plurality of first protruding patterns 740 adjacent to each other.

The plurality of lower slits 750 are surrounded by the plurality of first protruding patterns 740 and the third adhesive layer 930 and each of the plurality of lower slits 750 can correspond to a concave portion provided between each of the plurality of first protruding patterns 740 adjacent to each other.

The electrophoresis liquid 760 can be prepared by mixing light blocking particles 761 and a transparent fluid 763. When the first base film 710 and the third base film 920 are adhered together to form the plurality of lower slits 750 surrounded by the plurality of first protruding patterns 740 and the third adhesive layer 930, the electrophoresis liquid 760 can be injected into the plurality of lower slits 750.

The second light path control layer 800 includes a second base film 810, an upper driving electrode pattern 820, a plurality of second protruding patterns 840, a plurality of upper slits 850, an electrophoresis liquid 860.

The second base film 810 can support the upper driving electrode pattern 820.

The upper driving electrode pattern 820 can be patterned on the second base film 810. The upper driving electrode pattern 820 can face the common electrode 910 with a plurality of upper slits 850 interposed therebetween and the upper driving electrode pattern 820 can receive a driving voltage Vd from the display driving circuit section 300.

The plurality of second protruding patterns 840 can be adhered to the other surface of the common electrode 910 through the fourth adhesive layer 940. That is, the common electrode 910 can be disposed between the plurality of first protruding patterns 740 and the plurality of second protruding patterns 840 by the medium of the third and fourth adhesive layers 930 and 940 in the process of adhering the first base film 710 and the second base film 810. Specifically, the plurality of second protruding patterns 840 can be formed on the second base film 810 and the upper driving electrode pattern 820 and then adhered to the other surface of the common electrode 910 by the medium of the fourth adhesive layer 940. When the plurality of second protruding patterns 840 are adhered to the common electrode 910, the plurality of upper slits 850 surrounded by the plurality of second protruding patterns 840 and the fourth adhesive layer 940 can be formed. Therefore, each of the plurality of upper slits 850 can correspond to a concave portion provided between each of the plurality of second protruding patterns 840 adjacent to each other.

The plurality of upper slits 850 are surrounded by the plurality of second protruding patterns 840 and the fourth adhesive layer 940 and each of the plurality of upper slits 850 can correspond to a concave portion provided between each of the plurality of second protruding patterns 840 adjacent to each other.

The electrophoresis liquid 860 can be prepared by mixing light blocking particles 861 and a transparent fluid 863. When the second base film 810 and the first base film 710 are adhered together to form the plurality of upper slits 850 surrounded by the plurality of second protruding patterns 840 and the fourth adhesive layer 940, the electrophoresis liquid 860 can be injected into the plurality of upper slits 850.

Figure 25:
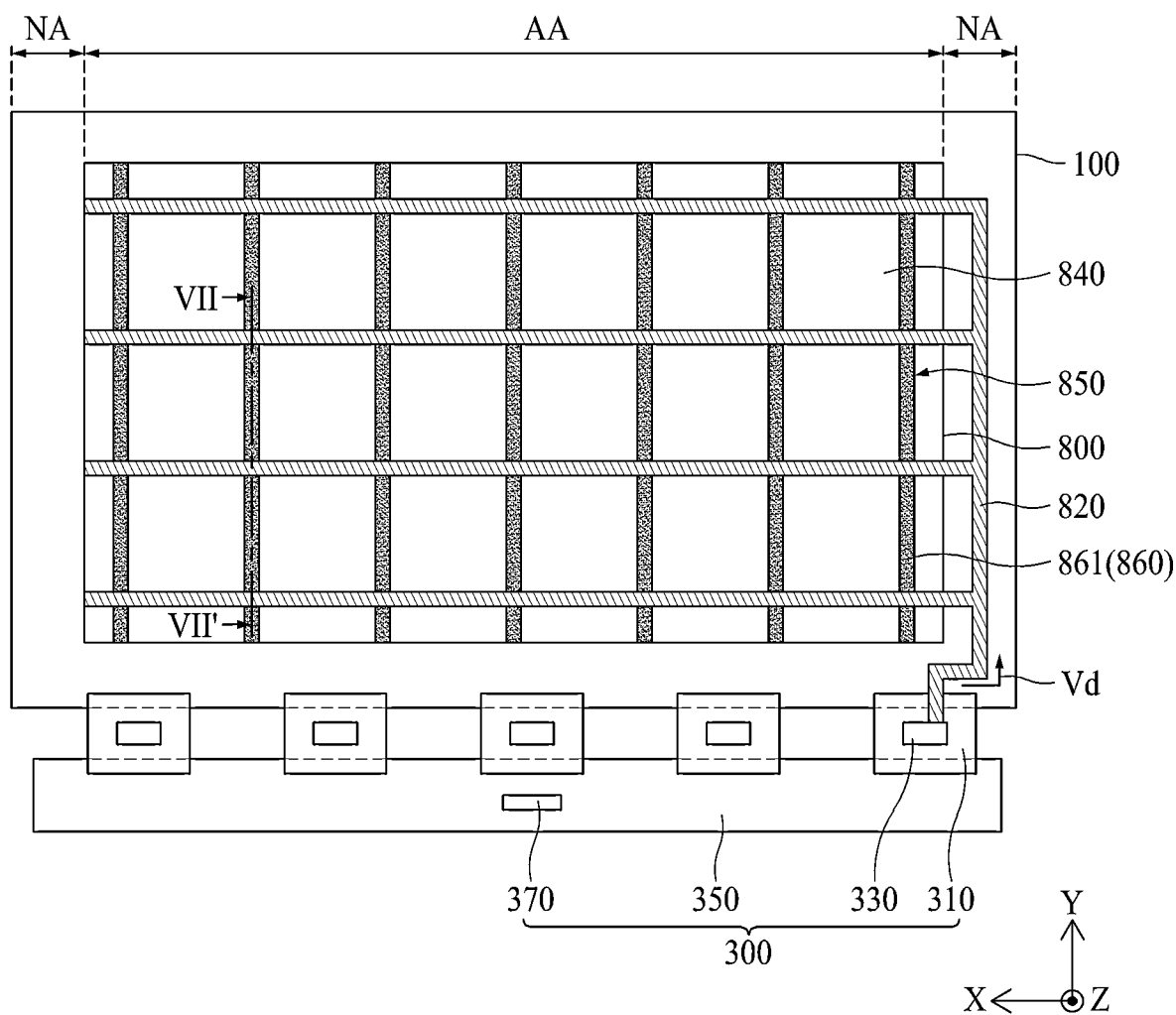
FIG. 25 is a plan view showing a display apparatus according to another embodiment of the present disclosure.
Figure 26:
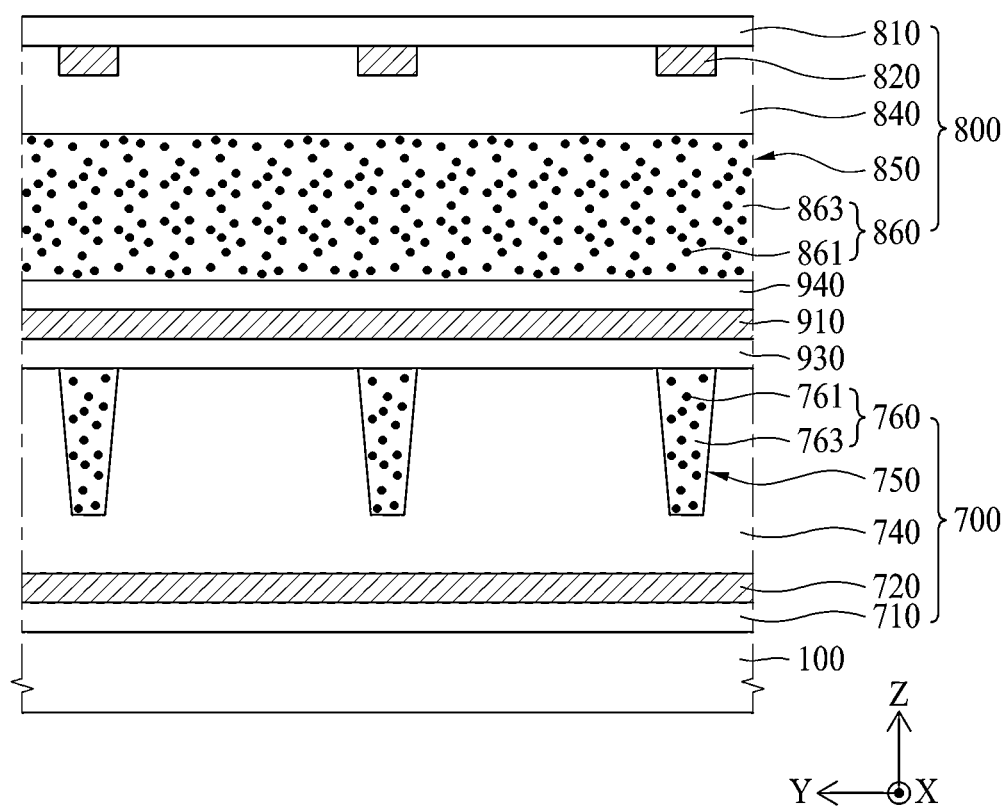
FIG. 26 is a cross-sectional view taken along line VII-VII' in the display apparatus shown in FIG. 25 according to an embodiment of the present disclosure.

FIG. 25 is a plan view showing a display apparatus according to a ninth embodiment of the present disclosure, and FIG. 26 is a cross-sectional view taken along line VII-VII' in the display apparatus shown in FIG. 25. Here, the display apparatus according to the ninth embodiment shown in FIGS. 25 and 26 has an arrangement of the second light path control layer 800 different from the display apparatus according to the eighth embodiment shown in FIGS. 23 and 24, and the same configuration as the above-described configuration will be briefly described or omitted.

Referring to FIGS. 25 and 26, the first light path control layer 700 can include a first base film 710, a lower driving electrode pattern 720, a plurality of first protruding patterns 740, a plurality of lower slits 750, and an electrophoresis liquid 760.

The first base film 710 can support the lower driving electrode pattern 720.

The lower driving electrode pattern 720 can be patterned on the first base film 710. Also, the lower driving electrode pattern 720 can face the common electrode 910 with a plurality of lower slits 750 interposed therebetween and the lower driving electrode pattern 720 can receive a driving voltage Vd from the display driving circuit section 300.

The plurality of first protruding patterns 740 can be adhered on one surface of the common electrode 910 through the third adhesive layer 930. Specifically, the plurality of first protruding patterns 740 can be formed on the first base film 710 and the lower driving electrode pattern 720 and then adhered to one surface of the common electrode 910 by the medium of the third adhesive layer 930.

The plurality of lower slits 750 are surrounded by the plurality of first protruding patterns 740 and the third adhesive layer 930 and each of the plurality of lower slits 750 can correspond to a concave portion provided between each of the plurality of first protruding patterns 740 adjacent to each other.

The electrophoresis liquid 760 can be prepared by mixing light blocking particles 761 and a transparent fluid 763. When the first base film 710 and the third base film 920 are adhered together to form the plurality of lower slits 750 surrounded by the plurality of first protruding patterns 740 and the third adhesive layer 930, the electrophoresis liquid 760 can be injected into the plurality of lower slits 750.

The second light path control layer 800 includes a second base film 810, an upper driving electrode pattern 820, a plurality of second protruding patterns 840, a plurality of upper slits 850, an electrophoresis liquid 860.

The second base film 810 can support the upper driving electrode pattern 820.

The upper driving electrode pattern 820 can be patterned on the second base film 810. The upper driving electrode pattern 820 can face the common electrode 910 with a plurality of upper slits 850 interposed therebetween and the upper driving electrode pattern 820 can receive a driving voltage Vd from the display driving circuit section 300.

The upper driving electrode pattern 820 can be arranged to intersect a longitudinal direction of the plurality of upper slits 850. According to an example, the upper driving electrode pattern 820 can be disposed such that a region thereof overlapping the plurality of upper slits 850 is minimized. Also, the upper driving electrode pattern 820 can be disposed to intersect the lower driving electrode pattern 720 on the display panel 100. For example, if each of the plurality of upper slits 850 has a line shape extending in the second direction Y, the upper driving electrode pattern 820 can extend in the first direction X perpendicular to the second direction Y. In this manner, the arrangement structure of the upper driving electrode patterns 820 is changed according to the arrangement structure of the plurality of upper slits 850, whereby the region in which the upper driving electrode patterns 820 overlap the plurality of upper slits 850 can be minimized.

The plurality of second protruding patterns 840 can be adhered to the other surface of the common electrode 910 through the fourth adhesive layer 940. That is, the common electrode 910 can be disposed between the plurality of first protruding patterns 740 and the plurality of second protruding patterns 840 by the medium of the third and fourth adhesive layers 930 and 940 in the process of adhering the first base film 710 and the second base film 810. Specifically, the plurality of second protruding patterns 840 can be formed on the second base film 810 and the upper driving electrode pattern 820 and then adhered to the other surface of the common electrode 910 by the medium of the fourth adhesive layer 940.

The plurality of upper slits 850 are surrounded by the plurality of second protruding patterns 840 and the fourth adhesive layer 940 and each of the plurality of upper slits 850 can correspond to a concave portion provided between each of the plurality of second protruding patterns 840 adjacent to each other. As described above, each of the plurality of upper slits 850 can have a line shape extending in the second direction Y, but the plurality of upper slits 850 are not limited thereto and can be arranged in various forms.

The electrophoresis liquid 860 can be prepared by mixing light blocking particles 861 and a transparent fluid 863. When the second base film 810 and the first base film 710 are adhered together to form the plurality of upper slits 850 surrounded by the plurality of second protruding patterns 840 and the fourth adhesive layer 940, the electrophoresis liquid 860 can be injected into the plurality of upper slits 850.

The plurality of lower slits 750 and the plurality of upper slits 850 are arranged to intersect each other on the display panel 100 so that the first and second light path control layers 700 and 800 can control both the side viewing angle in the first direction X and the side viewing angle in the second direction Y. For example, the first light path control layer 700 can include the plurality of lower slits 750 extending in the first direction X to thereby control the side viewing angle in the second direction Y, and the second light path control layer 800 can include the plurality of upper slits 850 extending in the second direction Y to thereby control the side viewing angle in the first direction X.

Therefore, when the driving voltage Vd is not applied to the lower driving electrode pattern 720 and the upper driving electrode pattern 820, light traveling between the front side Z of the display apparatus and the second direction Y can be absorbed by the first light path control layer 700 and light traveling between the front side Z of the display apparatus and the first direction X can be absorbed by the second light path control layer 800. As a result, since the plurality of lower slits 750 and the plurality of upper slits 850 are arranged to intersect each other on the display panel 100, both the side viewing angle of the first direction X and the side viewing angle of the second direction Y can be controlled to enhance a shielding characteristic in a state that the driving voltage Vd is not applied to the lower driving electrode pattern 720 and the upper driving electrode pattern 820.

Figure 27:
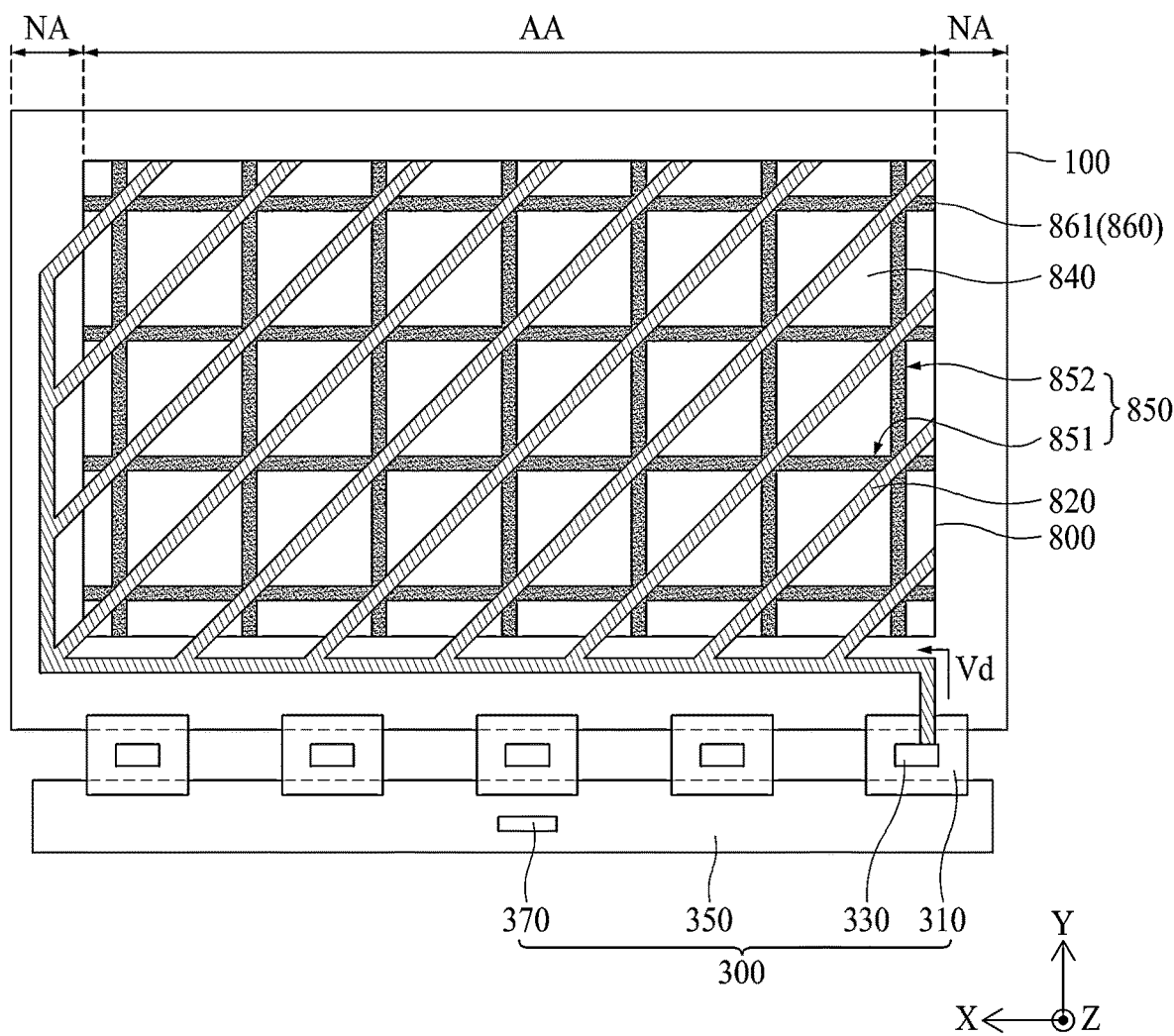
FIG. 27 is a plan view showing a display apparatus according to another embodiment of the present disclosure.
Figure 28:
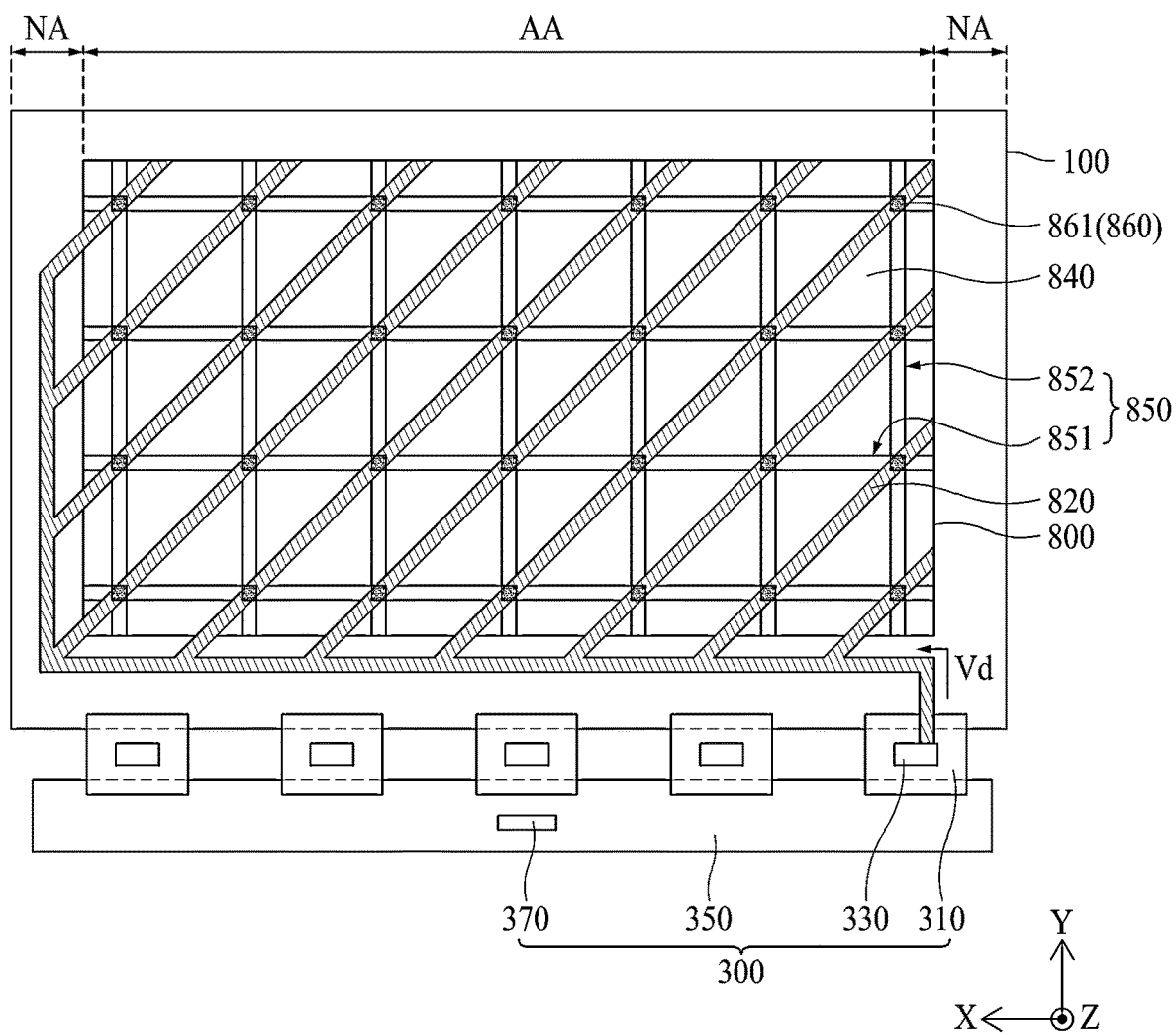
FIG. 28 is a view illustrating a state in which a driving voltage is applied to each of a lower driving electrode pattern and an upper driving electrode pattern in the display apparatus shown in FIG. 27 according to an embodiment of the present disclosure.
Figure 29:
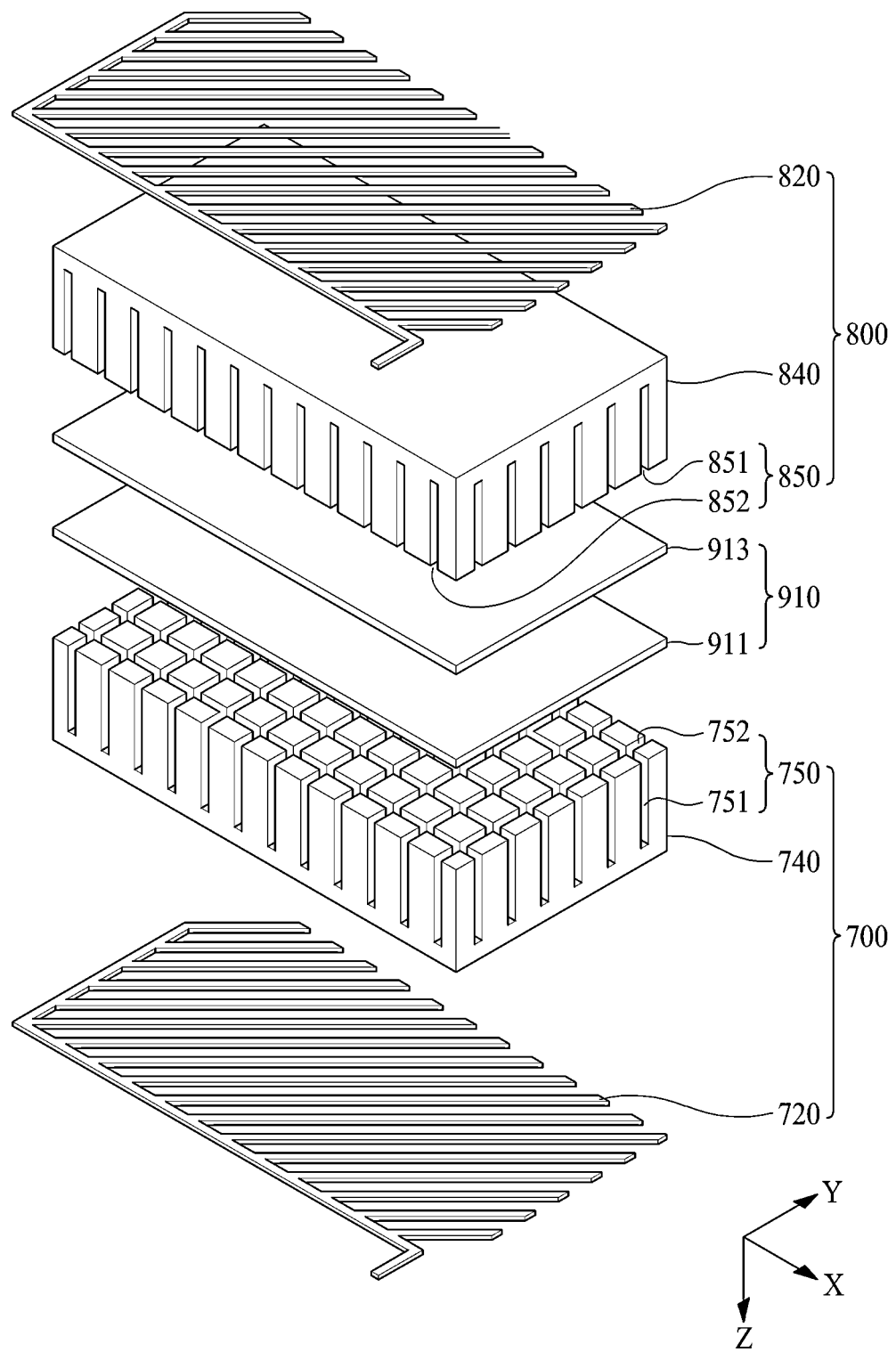
FIG. 29 is a perspective view showing first and second light path control layers shown in FIG. 27 according to an embodiment of the present disclosure.

FIG. 27 is a plan view showing a display apparatus according to a tenth embodiment of the present disclosure. FIG. 28 is a view illustrating a state in which a driving voltage is applied to each of the lower driving electrode pattern and the upper driving electrode pattern in the display apparatus shown in FIG. 27, and FIG. 29 is a perspective view showing first and second light path control layers shown in FIG. 27. Here, the tenth embodiment of FIGS. 27 to 29 has a configuration of the lower driving electrode pattern 720, the upper driving electrode pattern 820, the plurality of first protruding patterns 740, the plurality of second protruding patterns 840, a plurality of lower slits 750, and a plurality of upper slits 850, which are different from the seventh embodiment of FIGS. 18 to 22, and the same configuration as the above-described configuration will be briefly described or omitted. For example, the plurality of upper slits 850 of the display apparatus of FIGS. 18 to 22 have a line shape extending in the first direction X and the plurality of upper slits 850 of the display apparatus of FIGS. 27 to 29 can include a plurality of first upper slits 851 extending in the first direction X and a plurality of second upper slits 852 extending in the second direction Y perpendicular to the first direction X. Accordingly, it is assumed that the display apparatus of FIGS. 27 to 29 is the same as the display apparatus of FIGS. 18 to 22, except for the configuration of the upper driving electrode pattern 820 and the plurality of second protruding patterns 840 changed due to the inclusion of the plurality of first and second upper slits 851 and 852. Also, since the structure of the lower driving electrode pattern 720, the plurality of first protruding patterns 740 and the plurality of lower slits 750 correspond to the structure of the upper driving electrode pattern 820, the plurality of second protruding patterns 840, and the plurality of upper slits 850, descriptions of the structure of the lower driving electrode pattern 720, the plurality of first protruding patterns 740 and the plurality of lower slits 750 will be omitted.

The plurality of second protruding patterns 840 can be adhered to the second common electrode 913 through the fourth adhesive layer 940. Specifically, the plurality of second protruding patterns 840 can be formed on the second base film 810 and the upper driving electrode pattern 820 and then adhered to the second common electrode 913 by the medium of the fourth adhesive layer 940. When the plurality of second protruding patterns 840 are adhered to the upper driving electrode pattern 820 through the fourth adhesive layer, the plurality of upper slits 850 surrounded by the plurality of second protruding patterns 840 and the fourth adhesive layer 940 can be formed. Therefore, each of the plurality of upper slits 850 can correspond to a concave portion provided between each of the plurality of second protruding patterns 840 adjacent to each other.

The plurality of upper slits 850 are surrounded by the plurality of second protruding patterns 840 and the fourth adhesive layer 940 and each of the plurality of upper slits 850 can correspond to a concave portion provided between each of the plurality of adjacent second protruding patterns 840. For example, the plurality of upper slits 850 can include a plurality of first upper slits 851 extending in the first direction X and a plurality of second upper slits 852 extending in the second direction Y perpendicular to the first direction X. That is, when the first and second upper slits 851 and 852 has a lattice shape extending in the first direction X and the second direction Y, respectively, the upper driving electrode pattern 820 can extend in a diagonal direction between the first direction X and the second direction Y. Accordingly, the upper driving electrode pattern 820 can extend in the direction in which the region overlapping the plurality of upper slits 850 is minimized. Since the arrangement structure of the upper driving electrode pattern 820 is changed according to the arrangement structure of the plurality of upper slits 850, the region where the upper driving electrode pattern 820 overlap the plurality of upper slits 850 can be minimized and the area where the light blocking particles 861 are concentrated can be minimized to improve the aperture ratio of the display panel 100.

As described above, each of the plurality of upper slits 850 can have a lattice shape extending in the first direction X and the second direction Y that intersects the first direction X, but the present disclosure is not limited thereto and the plurality of slits 250 can be arranged in various forms.

As shown in FIG. 27, the light blocking particles 861 included in the electrophoresis liquid 860 can be scattered in the entire region of the plurality of first and second upper slits 851 and 852 unless the driving voltage Vd is applied to the upper driving electrode pattern 820. Specifically, when the light blocking particles 861 are scattered in the entire region of the first and second upper slits 851 and 852, the light blocking particles 861 can block a partial amount of the light emitted from the display panel 100. For example, the plurality of first upper slits 851 can extend in the first direction X to thereby control the side viewing angle in the second direction Y and the plurality of second upper slits 852 can extend in the second direction Y to thereby control the side viewing angle in the first direction X. That is, the second light path control layer 800 can scatter the light blocking particles 861 in the entire region of the first and second upper slits 851 and 852 to control the wide viewing angle of the display apparatus.

As shown in FIG. 28, when the driving voltage Vd is applied to the upper driving electrode pattern 820, the light blocking particles 861 can be concentrated on the overlapping region (or intersection region) of the upper driving electrode pattern 820 and the plurality of first and second upper slits 851 and 852. In addition, only the transparent fluid 283 may remain in a region of the plurality of first and second upper slits 851 and 852 that does not intersect the upper driving electrode pattern 820. Specifically, the upper driving electrode pattern 820 can receive the driving voltage Vd from a driving integrated circuit 330 of the display driving circuit section 300, and the light blocking particles 861 can concentrate on the shortest distance between the upper driving electrode pattern 820 and the plurality of first and second upper slits 851 and 852. That is, the light blocking particles 861 can move from the region where the upper driving electrode pattern 820 and the plurality of first and second upper slits 851 and 852 do not overlap to the region where the upper driving electrode pattern 820 and the plurality of first and second upper slits 851 and 852 overlap each other with respect to the first and second directions X and Y. Also, when the driving voltage Vd is applied to the upper driving electrode pattern 820, the light blocking particles 861 can move toward the upper driving electrode pattern 820 with respect to the third direction Z perpendicular to the first direction X and the second direction Y. Also, when the light blocking particles 861 concentrate on the shortest distance between the upper driving electrode pattern 820 and the plurality of first and second upper slits 851 and 852, only the transparent fluid 283 may remain in the remaining area of the plurality of first and second upper slits 851 and 852. When the light blocking particles 861 concentrate on the overlap region of the upper driving electrode pattern 820 and the plurality of first and second upper slits 851 and 852, the second light path control layer 800 can allow the light emitted from the display panel 100 to be transmitted therethrough. For example, the light emitted in the front and front diagonal directions of the display panel 100 can be transmitted through the second light path control layer 800 without being blocked by the light blocking particles 861.

The display apparatus according to the present disclosure can improve the aperture ratio of the display panel 100 by concentrating the light blocking particles 861 on the overlapping region of the upper driving electrode pattern 820 and the plurality of upper slits 850.

Figure 30:
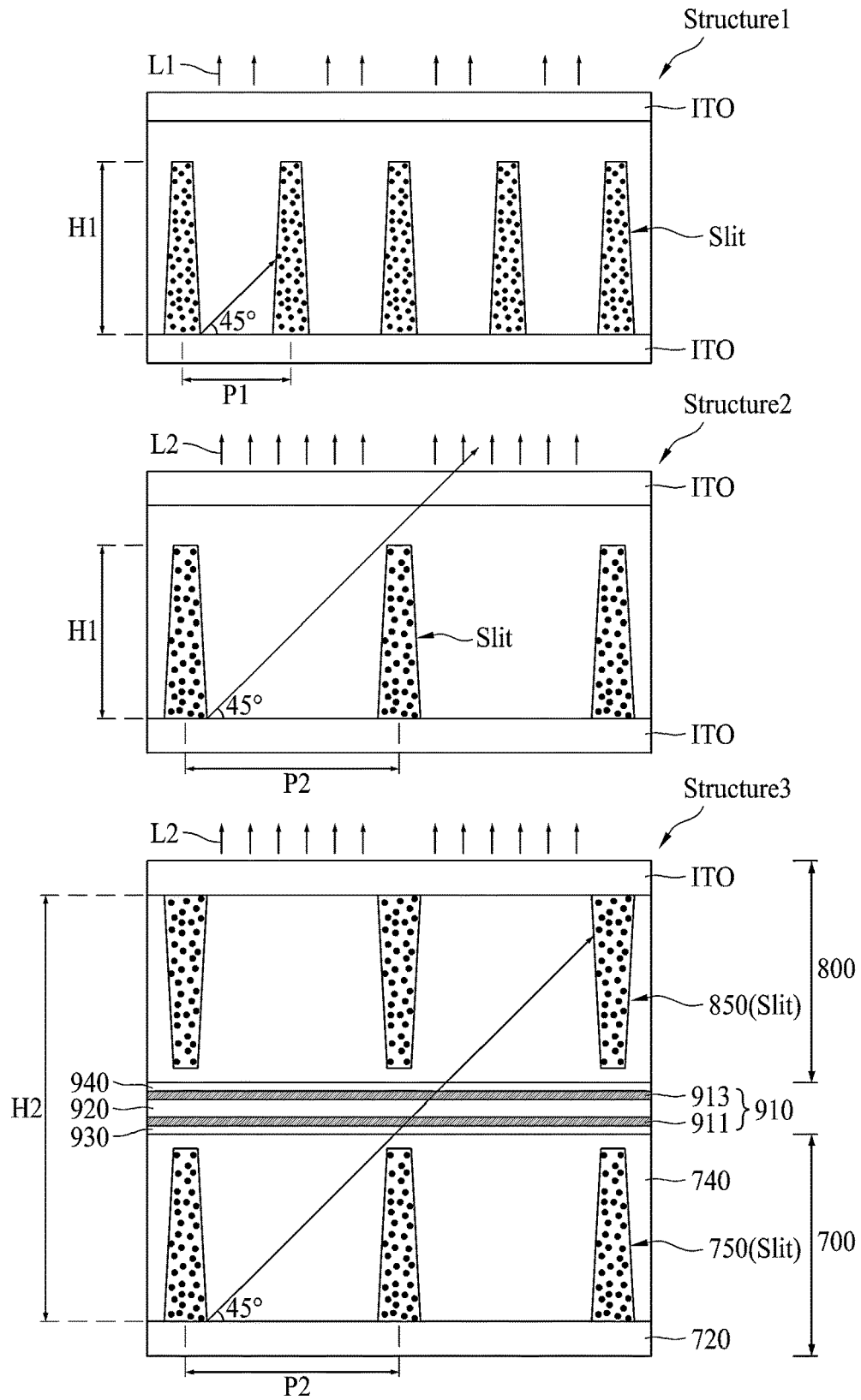
FIG. 30 is a view illustrating light efficiency and a shielding characteristic depending on widths, intervals, and heights of a plurality of slits of a light path control film according to embodiments of the present disclosure.

FIG. 30 is a view illustrating light efficiency and shielding characteristics according to widths, intervals, and heights of a plurality of slits of light path control films. Here, a light path control film of a first structure (Structure1) includes a plurality of slits arranged according to a first pitch P1 and having a first height H1, a light path control film of a second structure (Structure2) includes a plurality of slits arranged according to a second pitch P2 and having the first height H1, and a light path control film of a third structure (Structure3) includes a plurality of slits arranged according to the second pitch P2 and having a second height H2. For example, the second pitch P2 corresponds to twice the first pitch P1 and the second height H2 corresponds to twice the first height H1. The third structure (Structure3) corresponds to the display apparatus according to the seventh embodiment of the present disclosure shown in FIGS. 18 to 22.

Referring to FIG. 30, the display apparatus according to the present disclosure includes the first and second light path control layers 700 and 800, thereby achieving light efficiency or shielding characteristic higher than a display apparatus including one light path control layer. Here, the shielding characteristic refers to a shielding characteristic against light incident on the light path control film at an angle of 45°.

Specifically, the display apparatus having the third structure (Structure3) includes the plurality of lower slits 750 and the plurality of upper slits 850 arranged at the second pitch P2 and having the second height H2, thereby obtaining the light efficiency L2 higher than the light efficiency L1 of the display apparatus having the first structure (Struture1), while having the same level of shielding characteristic as the display apparatus having the first structure (Structure1) including the plurality of slits arranged at the first pitch P1 and having the first height H1. Here, the pitch of the plurality of slits corresponds to a distance between the centers of the two adjacent slits. For example, the display apparatus having the first structure (Structure1) has the same level of shielding characteristic as the display apparatus having the third structure (Structure3), but the pitch P1 of the plurality of slits of the display apparatus having the first structure (Structure1) is smaller than the pitch P2 of the plurality of lower slits 750 and the plurality of upper slits 850 of the display apparatus having the third structure (Structure3), and thus, the overlapping regions of the plurality of slits and the display panel increase to reduce light efficiency L1 of the display apparatus. Therefore, the light efficiency L2 of the display apparatus (Structure3) according to the present disclosure can be higher than the light efficiency L1 of the display apparatus (Structure1) including one light path control layer having the same level of shielding characteristic.

The display apparatus having the third structure (Structure3) includes the plurality of lower slits 750 and the plurality of upper slits 850 arranged at the second pitch P2 and having the second height H2, thereby obtaining a shielding characteristic higher than that of display apparatus having the second structure (Structure2) including the plurality of slits arranged at the second pitch P2 and having the first height H1, while having the same level of light efficiency. Here, the light efficiency can correspond to a rate at which light emitted from the display panel 100 passes through the light path control film. For example, the pitch P2 of the plurality of slits of the display apparatus having the second structure (Structure2) is equal to the pitch P2 of the plurality of lower slits 750 and the plurality of upper slits 850 of the display apparatus having the third structure (Structure3), and thus, the display apparatus having the second structure (Structure2) can have the same level of light efficiency as that of the display apparatus having the third structure (Structure3). However, since the height H2 of the plurality of upper slits 850 of the display apparatus having the third structure (Structure3) is higher than the height H1 of the plurality of slits of the display apparatus having the second structure (Structure2), the display apparatus having the third structure (Structure3) can have a shielding characteristic higher than the display apparatus having the second structure (Structure 2). For example, since the display apparatus having the third structure (Structure3) can block light not blocked by the plurality of lower slits 750 by the plurality of upper slits 850, the display apparatus having the third structure (Structure2) can have a shielding characteristic higher than the display apparatus having the second structure (Structure2). Therefore, the display apparatus (Struture3) according to the present disclosure can have a shielding characteristic higher than the display apparatus (Structure2) including one light path control layer having the same level of light efficiency.

As described above, the display apparatus having the first structure (Structure1), the display apparatus having the second structure (Structure2), and the display apparatus having the third structure (Structure3) can have an optical characteristic as shown in Table 3 below.

TABLE 3

|  | First structure | Second structure | Third structure |
| --- | --- | --- | --- |
| Light efficiency (aperture ratio) | 100% | 130% | 130% |
| Shielding characteristic | 100% | 0% | 112% |

Here, as for light efficiency, light efficiency of the display apparatus having the first structure (Structure1) is assumed as 100%, based on which light efficiencies of other structures of the display apparatuses were compared. Also, as for shielding characteristic, the shielding characteristic of the display apparatus having the first structure (Structure1) is assumed as 100%, based on which light efficiencies of other structures of the display apparatuses were compared. 0% of the shielding characteristic of the second structure (Structure2) refers to that the display apparatus having the second structure (Structure2) is difficult to block light incident at the angle of 45° on the light path control film.

Therefore, the display apparatus (Structure3) according to the present disclosure has light efficiency higher than that of the display apparatus having the first structure (Structure1), while having the same level of shielding characteristic. Also, the display apparatus (Structure 3) according to the present disclosure has a shielding characteristic higher than that of the display apparatus having the second structure (Structure2), while having the same level of light efficiency.

Figure 31A:
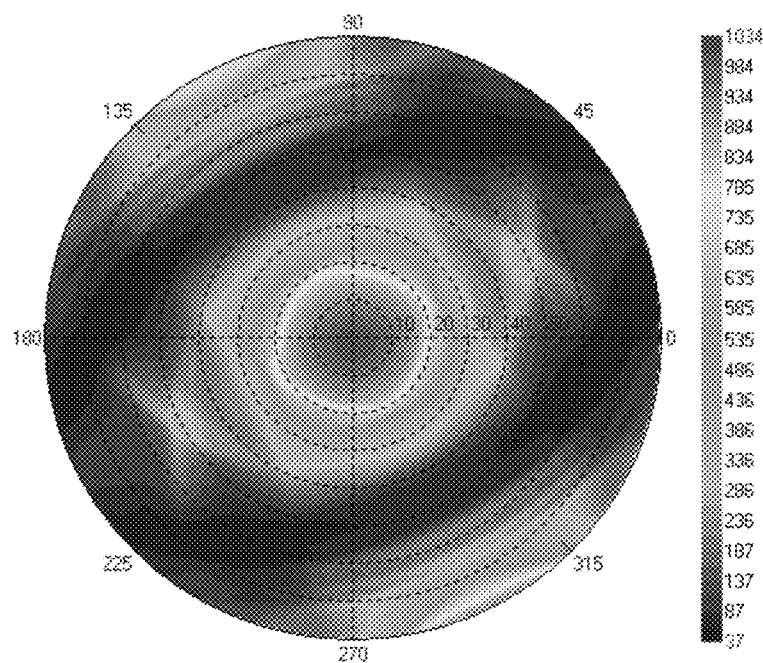
FIGS. 31A and 31B show optical profiles of the first mode and the second mode in the display apparatus shown in FIG. 18 according to an embodiment of the present disclosure.
Figure 31B:
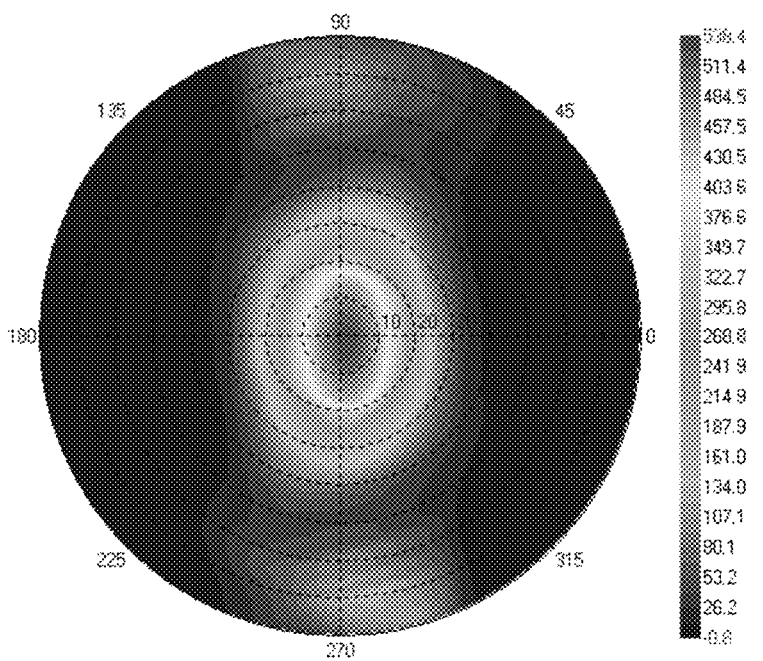

FIG. 31 is a diagram showing optical profiles of the first mode and the second mode in the display apparatus shown in FIG. 18. Here, FIG. 31A corresponds to an optical profile according to the first mode or the wide viewing angle mode of the display apparatus, and FIG. 31B corresponds to an optical profile according to the second mode or the narrow viewing angle mode of the display apparatus. The luminance observed in the display apparatuses of FIGS. 31A and 31B can correspond to 0 to 108.

Referring to FIGS. 31A and 31B, the display apparatus of the first mode and the display apparatus of the second mode can have transmittance as shown in Table 4 below.

TABLE 4

|  |  | First mode | Second mode |
| --- | --- | --- | --- |
| Center | Luminance [nit] | 107.4 | 106.6 |
|  | Transmittance [%] | 35.2% | 34.9% |
| Side 45° | Luminance [nit] | 15.8 | 1.6 |
|  | Transmittance [%] | 14.74% | 1.52% |

TABLE 4-continued

|  |  | First mode | Second mode |
| --- | --- | --- | --- |
| Side −45° | Luminance [nit] | 19.5 | 1.1 |
|  | Transmittance [%] | 18.12% | 1.0% |

Here, the display apparatus of the first mode corresponds to a state in which the driving voltage Vd is applied to the lower driving electrode pattern 720 and the upper driving electrode pattern 820, and the display apparatus of the second mode corresponds to a state in which the driving voltage Vd is not applied to the lower driving electrode pattern 720 and the upper driving electrode pattern 820. The middle of Table 4 corresponds to luminance observed at the front side of the display apparatus, and the side 45° and the side −45° correspond to luminance observed at the front diagonal 45° and the diagonal 45° of the display apparatus.

Therefore, in the display apparatus according to the present disclosure, in the first mode, the light blocking particles 761 and 861 can be concentrated on the shortest distance between the lower driving electrode pattern 720 and the plurality of lower slits 750 or the shortest distance between the upper driving electrode pattern 820 and the plurality of upper slits 850, thereby allowing the light emitted from the display panel 100 to be transmitted therethrough.

Also, in the display apparatus according to the present disclosure, in the second mode, the light blocking particles 761 and 861 are scattered in the entire region of the plurality of lower slits 750 and the plurality of upper slits 850 to block light emitted in the front diagonal line of the display panel 100, thereby controlling the side viewing angle.

The display apparatus according to the present disclosure can control the wide viewing angle by scattering the light blocking particles in the entirety of the plurality of slits and improve the aperture ratio of the display panel and ensure visibility by concentrating the light blocking particles on a specific portion of the plurality of slits.

The display apparatus according to the present disclosure can ensure outdoor visibility, while reducing power consumption, by implementing a wide viewing angle by concentrating light blocking particles on a specific portion of the plurality of slits in the first mode, and control a viewing angle by implementing a narrow viewing angle by scattering the light blocking particles in the entirety of the plurality of slits in the second mode.

The display apparatus according to the present disclosure can minimize the region where the plurality of slits and the driving electrode pattern overlap, thereby minimizing a region where the light blocking particles are concentrated and maximizing an aperture ratio of the display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
    a display panel;
    an upper light path control film disposed on the display panel; and
    a lower light path control film disposed on the display panel,
    wherein the upper light path control film includes:
        a plurality of upper protruding patterns,
        a plurality of upper slits,
        a first electrophoresis liquid disposed in the plurality of upper slits,
        a plurality of first light blocking particles in the first electrophoresis liquid, and
        an upper driving electrode pattern disposed to intersect a longitudinal direction of the plurality of upper slits,
    wherein the lower light path control film includes:
        a plurality of lower protruding patterns,
        a plurality of lower slits,
        a second electrophoresis liquid disposed in the plurality of lower slits,
        a plurality of second light blocking particles in the second electrophoresis liquid, and
        a lower driving electrode pattern disposed to intersect a longitudinal direction of the plurality of lower slits,
    wherein the upper driving electrode pattern is configured to concentrate the plurality of first light blocking particles on intersection regions of the plurality of upper slits and the upper driving electrode pattern or scatter the plurality of first light blocking particles throughout the plurality of upper slits based on a first driving voltage,
    wherein the plurality of upper slits are surrounded by the plurality of upper protruding patterns and each of the plurality of upper slits has an upper concave portion disposed in the upper light path control film between adjacent upper protruding patterns among the plurality of upper protruding patterns,
    wherein the upper concave portion in each of the plurality of upper slits has a tapered shape in which a width of an inner surface of the upper concave portion is smaller than a width of an opening surface of the upper concave portion,
    wherein the opening surface of the upper concave portion is disposed closer to the display panel than the inner surface of the upper concave portion,
    wherein the lower driving electrode pattern is configured to concentrate the plurality of second light blocking particles on intersection regions of the plurality of lower slits and the lower driving electrode pattern or scatter the plurality of second light blocking particles throughout the plurality of lower slits based on a second driving voltage,
    wherein the plurality of lower slits are surrounded by the plurality of lower protruding patterns and each of the plurality of lower slits has an lower concave portion disposed in the lower light path control film between adjacent lower protruding patterns among the plurality of lower protruding patterns,
    wherein the lower concave portion in each of the plurality of lower slits has a tapered shape in which a width of an inner surface of the lower concave portion is smaller than a width of an opening surface of the lower concave portion, and
    wherein the opening surface of the lower concave portion is disposed farther away from the display panel than the inner surface of the inner concave portion.

2. The display apparatus of claim 1, wherein the upper light path control film further includes:
    a first base film disposed on the upper driving electrode pattern,
    an adhesive layer adhering the plurality of upper protruding patterns to the upper driving electrode pattern,
    a common electrode disposed on the plurality of upper protruding patterns, and
    a second base film disposed on the common electrode, and
    wherein each of the plurality of upper slits is disposed between adjacent upper protruding patterns among the plurality of upper protruding patterns.

3. The display apparatus of claim 1, wherein the upper light path control film is configured to transmit light emitted from the display panel through the upper light path control film in a first mode and block a portion of the light emitted from the display panel in a second mode based on the first driving voltage.

4. The display apparatus of claim 1, wherein the first electrophoresis liquid further includes:
    the first light blocking particles having an electrophoretic characteristic and a light blocking characteristic, and
    a transparent fluid configured to flow in the plurality of upper slits.

5. The display apparatus of claim 1, wherein each of the plurality of upper slits has a line shape extending in a first direction, and
    wherein the first driving electrode pattern extends in a second direction perpendicular to the first direction.

6. The display apparatus of claim 1, wherein the plurality of upper slits have a lattice shape extending in a first direction and a second direction perpendicular to the first direction, and
    wherein the upper driving electrode pattern extends in a diagonal direction relative to the first and second directions.

7. The display apparatus of claim 6, wherein the upper driving electrode pattern extends in the diagonal direction and overlaps with vertices of the lattice shape.

8. The display apparatus of claim 1, wherein the plurality of upper slits respectively overlap with the plurality of lower slits.

9. A display apparatus comprising:
    a display panel including a thin film transistor layer including a plurality of thin film transistors and light emitting element layers respectively connected to the plurality of thin film transistors to form a plurality of light emitting areas;
    an upper path control film disposed on the display panel; and
    a lower light path control film disposed on the display panel,
    wherein the upper light path control film includes:
        a plurality of upper protruding patterns,
        a plurality of upper slits,
        first light blocking particles disposed in the plurality of upper slits, and
        an upper driving electrode pattern intersecting a longitudinal direction of the plurality of upper slits,
    wherein the lower light path control film includes:
        a plurality of lower protruding patterns,
        a plurality of lower slits,
        second light blocking particles disposed in the plurality of lower slits, and a lower driving electrode pattern intersecting a longitudinal direction of the plurality of lower slits, wherein the first light blocking particles are configured to:
concentrate at regions within the plurality of upper slits where the plurality of upper slits and the upper driving electrode pattern cross each other at intersection regions, and
scatter throughout the plurality of upper slits, wherein the second light blocking particles are configured to:
concentrate at regions within the plurality of lower slits where the plurality of lower slits and the lower driving electrode pattern cross each other at intersection regions, and
scatter throughout the plurality of lower slits, wherein the plurality of upper slits are surrounded by the plurality of upper protruding patterns and each of the plurality of upper slits has an upper concave portion disposed in the upper light path control film between adjacent upper protruding patterns among the plurality of upper protruding patterns, wherein the upper concave portion in each of the plurality of upper slits has a tapered shape in which a width of an inner surface of the upper concave portion is smaller than a width of an opening surface of the upper concave portion, wherein the opening surface of the upper concave portion is disposed closer to the display panel than the inner surface of the upper concave portion, wherein the plurality of lower slits are surrounded by the plurality of lower protruding patterns and each of the plurality of lower slits has a lower concave portion disposed in the lower light path control film between adjacent lower protruding patterns among the plurality of lower protruding patterns, wherein the lower concave portion in each of the plurality of lower slits has a tapered shape in which a width of an inner surface of the lower concave portion is smaller than a width of an opening surface of the lower concave portion, and wherein the opening surface of the lower concave portion is disposed farther away from the display panel than the inner surface of the lower concave portion.

10. The display apparatus of claim 9, wherein the display panel further includes a black matrix disposed between each of the plurality of light emitting areas, and
wherein the intersection regions of the plurality of upper slits and the upper driving electrode pattern overlap with the black matrix.

11. The display apparatus of claim 9, further comprising:
a circuit film adhered to a pad part of the display panel; and
a driving integrated circuit mounted on the circuit film, the driving integrated circuit film being configured to supply a data voltage to the plurality of thin film transistors and a driving voltage to the upper driving electrode pattern.

* * * * *